United States Patent
Suzuki et al.

(10) Patent No.: US 12,352,925 B2
(45) Date of Patent: Jul. 8, 2025

(54) ANTI-REFLECTION CIRCULAR POLARISER AND IMAGE DISPLAY DEVICE USING SAME

(71) Applicant: TOYOBO CO., LTD., Osaka (JP)

(72) Inventors: Toshitake Suzuki, Osaka (JP); Toshiki Inoue, Tsuruga (JP); Hiroshi Shibano, Osaka (JP)

(73) Assignee: TOYOBO CO., LTD., Osaka (JP)

( * ) Notice: Subject to any disclaimer, the term of this patent is extended or adjusted under 35 U.S.C. 154(b) by 850 days.

(21) Appl. No.: 17/598,751

(22) PCT Filed: Mar. 19, 2020

(86) PCT No.: PCT/JP2020/012405
§ 371 (c)(1),
(2) Date: Sep. 27, 2021

(87) PCT Pub. No.: WO2020/196306
PCT Pub. Date: Oct. 1, 2020

(65) Prior Publication Data
US 2022/0187503 A1    Jun. 16, 2022

(30) Foreign Application Priority Data

Mar. 28, 2019    (JP) .................................. 2019-063698

(51) Int. Cl.
*G02B 5/30* (2006.01)
*G02B 1/111* (2015.01)
(Continued)

(52) U.S. Cl.
CPC .............. *G02B 1/111* (2013.01); *G02B 5/305* (2013.01); *G02B 5/3083* (2013.01); *H10K 50/86* (2023.02);
(Continued)

(58) Field of Classification Search
CPC ...... G02B 1/111; G02B 5/305; G02B 5/3083; H10K 50/86; H10K 59/8791
See application file for complete search history.

(56) References Cited

U.S. PATENT DOCUMENTS

2009/0257003 A1    10/2009    Yoshihara et al.
2013/0027634 A1*   1/2013     Saneto .............. G02F 1/133536
                                                          349/62
(Continued)

FOREIGN PATENT DOCUMENTS

CN    107852786 A    3/2018
EP     1933181 A1    6/2008
(Continued)

OTHER PUBLICATIONS

Japanese Patent Office, International Search Report in International Patent Application No. PCT/JP2020/012405 (Jun. 2, 2020).
(Continued)

*Primary Examiner* — Jeff W Natalini
*Assistant Examiner* — Brandon C Fox
(74) *Attorney, Agent, or Firm* — Leydig, Voit & Mayer, Ltd.

(57) ABSTRACT

An excellent anti-reflection circular polarizer for preventing the reflection of external light is provided, and thereby an excellent image display device with very little degradation of anti-reflection functionality caused by decreased levels of polarization under conditions of high humidity while having little deformation of an image display panel is provided. In particular, an anti-reflection circular polarizer suitable for an organic EL image display device is provided. The anti-reflection circular polarizer includes a reflection reduction layer, a light-transmissive substrate film, a polarizing element, and a λ/4 phase-difference layer, stacked in this order,
(Continued)

wherein the light-transmissive substrate film has a moisture permeability of 100 g/m²·day or less.

6 Claims, 2 Drawing Sheets

(51) Int. Cl.
  *H10K 50/86* (2023.01)
  *H10K 59/80* (2023.01)
(52) U.S. Cl.
  CPC ....... *H10K 59/873* (2023.02); *H10K 59/8791* (2023.02)

(56) References Cited

U.S. PATENT DOCUMENTS

| | | | |
|---|---|---|---|
| 2015/0022748 A1* | 1/2015 | Takeda | G02B 5/3016 349/194 |
| 2015/0331282 A1 | 11/2015 | Yamada et al. | |
| 2016/0054499 A1 | 2/2016 | Kuroda | |
| 2016/0062010 A1 | 3/2016 | Nam et al. | |
| 2018/0375065 A1* | 12/2018 | Hashimoto | H10K 59/879 |
| 2019/0072701 A1 | 3/2019 | Murashige et al. | |
| 2020/0142255 A1 | 5/2020 | Kitagawa et al. | |

FOREIGN PATENT DOCUMENTS

| | | | | |
|---|---|---|---|---|
| JP | 2013200445 A | * | 10/2013 | ............. G02B 5/305 |
| JP | 2014-016425 A | | 1/2014 | |
| JP | 2014-224894 A | | 12/2014 | |
| JP | 2017-015845 A | | 1/2017 | |
| JP | 2017-122910 A | | 7/2017 | |
| JP | 2017157330 A | * | 9/2017 | |
| JP | 2018-022060 A | | 2/2018 | |
| JP | 2018-205663 A | | 12/2018 | |
| KR | 10-2014-0147036 A | | 12/2014 | |
| KR | 10-2015-0100843 A | | 9/2015 | |
| KR | 10-2017-0086477 A | | 7/2017 | |
| KR | 10-2018-0084818 A | | 7/2018 | |
| TW | 200717045 A | | 5/2007 | |
| WO | WO 2014/157557 A1 | | 10/2014 | |
| WO | WO 2017/170211 A1 | | 10/2017 | |
| WO | WO 2018/003963 A1 | | 1/2018 | |

OTHER PUBLICATIONS

Japan Patent Office, Office Action in Japanese Patent Application No. 2021-509332 (Oct. 17, 2023).
European Patent Office, Extended European Search Report in European Patent Application No. 20777336.7 (Nov. 28, 2022).
Korean Intellectual Property Office, Office Action in Korean Patent Application No. 10-2021-7033759 (Jan. 30, 2025).

* cited by examiner

ANTI-REFLECTION CIRCULAR POLARISER AND IMAGE DISPLAY DEVICE USING SAME

TECHNICAL FIELD

The present invention relates to an anti-reflection polarizer (a polarizer for anti-reflection). More particularly, the present invention relates to an anti-reflection polarizer suitable for use in organic electroluminescent (organic EL) image display devices.

BACKGROUND ART

Conventional organic EL image display devices comprise an anti-reflection polarizer (circular polarizer) stacked on the viewing side of the image display devices in order to prevent display image quality deterioration and contrast reduction due to external light reflection. Such an anti-reflection polarizer comprises a polarizing element protection substrate, a polarizing element, and a λ/4 phase-difference layer stacked in this order from the viewer side. The polarizing element generally used is formed by allowing a polyvinyl alcohol (PVA) film to absorb iodine or a dichromatic pigment and uniaxially stretching the resulting film. Methods proposed to produce the λ/4 phase-difference layer are, for example, a method comprising forming an oriented liquid-crystal compound layer on a triacetyl cellulose (TAC) film, a method comprising stretching a cyclic polyolefin (COP) film or a modified acrylic film, and a method comprising directly transferring an oriented liquid-crystal compound layer to a PVA film. TAC film, described above, has been used as a polarizing element protection substrate, and its excellent characteristics, such as transparency and optical isotropy, have been utilized to achieve excellent image quality of organic EL image display devices (see, for example, Patent Literature (PTL) 1).

However, TAC is not only disadvantageous in terms of cost, such as due to the necessity of solution film formation, but also has insufficient moisture resistance and heat resistance. In particular, its high moisture permeability makes it impossible to prevent moisture penetration into polyvinyl alcohol (PVA) as a polarizing element in high-humidity conditions, which reduces antireflective functionality due to a decrease in the degree of polarization, and also causes problems such as deformation of the image display panel due to contraction of the polarizing element because the contraction force of the uniaxially oriented PVA polarizing element cannot be controlled, due to moisture absorption softening the TAC film.

CITATION LIST

Patent Literature

PTL 1: JP2017-15845A

SUMMARY OF INVENTION

Technical Problem

The present invention was made in view of the problems in related art. Specifically, an object of the present invention is to provide an excellent anti-reflection circular polarizer for preventing the reflection of external light, thereby providing an excellent image display device with very little degradation of anti-reflection functionality caused by decreased levels of polarization under conditions of high humidity while Having little deformation of the image display panel; in particular, an object of the present invention is to provide an anti-reflection circular polarizer suitable for organic EL image display devices.

Solution to Problem

The following shows the typical subject matter of the present invention.

Item 1.
An anti-reflection circular polarizer comprising
a reflection reduction layer,
a light-transmissive substrate film,
a polarizing element, and
a λ/4 phase-difference layer, stacked in this order,
wherein the light-transmissive substrate film has a moisture permeability of 100 g/m²·day or less.

Item 2.
The anti-reflection circular polarizer according to Item 1, wherein the light-transmissive substrate film is a polyester film.

Item 3.
The anti-reflection circular polarizer according to Item 1 or 2, wherein the light-transmissive substrate film has an in-plane retardation of 3000 to 30000 nm.

Item 4.
An image display device comprising the anti-reflection circular polarizer of any one of Items 1 to 3.

Item 5.
The image display device according to Item 4, which is an organic electroluminescence image display device.

Item 6.
The image display device according to Item 4, wherein a spectrum of light emitted from the image display device satisfies the following characteristics of (1) to (6) when the spectrum of the light is resolved into normally distributed peaks having peak tops in color regions of blue, green, and red, $$400 \text{ nm} \leq \lambda B \leq 495 \text{ nm}, \tag{1}$$

$$495 \text{ nm} < \lambda G \leq 580 \text{ nm}, \tag{2}$$

$$580 \text{ nm} < \lambda R \leq 680 \text{ nm}, \tag{3}$$

$$12 \text{ nm} \leq \alpha B \leq 30 \text{ nm}, \tag{4}$$

$$15 \text{ nm} \leq \alpha G \leq 45 \text{ nm}, \tag{5}$$

$$20 \text{ nm} \leq \alpha R \leq 60 \text{ nm}, \tag{6}$$

wherein λB represents a peak-top wavelength of a blue peak, λG represents a peak-top wavelength of a green peak, λR represents a peak-top wavelength of a red peak, αB represents a standard deviation of the blue peak, αG represents a standard deviation of the green peak, and αR represents a standard deviation of the red peak.

Advantageous Effects of Invention

The present invention provides an excellent anti-reflection circular polarizer for preventing the reflection of external light in image display devices, and thereby provides an excellent image display device (organic EL image display device) with very little degradation of anti-reflection functionality caused by decreased levels of polarization under conditions of high humidity while having little deformation of the image display panel.

DESCRIPTION OF EMBODIMENTS

Figure 1:
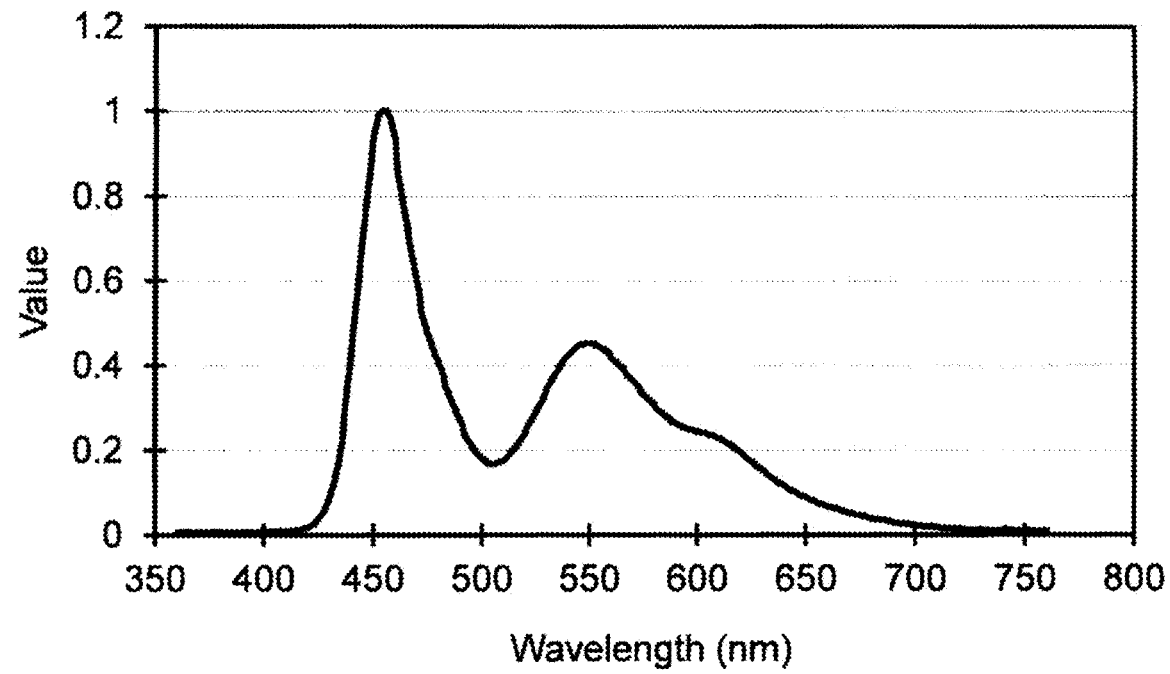
FIG. 1 shows an emission spectrum of organic EL display device A used in the Examples but with the circular polarizer removed from organic EL display device A.

The present invention relates to an anti-reflection circular polarizer including a reflection reduction layer, a light-transmissive substrate film, a polarizing element, and a λ/4 phase-difference layer. The reflection reduction layer, light-transmissive substrate film, polarizing element, and λ/4 phase-difference layer are preferably stacked in this order. The phrase "in this order" means that the reflection reduction layer, light-transmissive substrate film, polarizing element, and λ/4 phase-difference layer are basically stacked in this order, but also indicates the concept of including the case in which another layer is present between the layers. The anti-reflection circular polarizer according to the present invention is usable in image display devices that include an organic EL optical source.

Light-transmissive Substrate Film

First, the light-transmissive substrate film is described. The light-transmissive substrate film may simply be referred to as a "substrate film" below.

The upper limit of the moisture permeability of the substrate film is preferably 100 g/m$^2$·day or less, more preferably 50 g/m$^2$·day, still more preferably 30 g/m$^2$·day, particularly preferably 20 g/m$^2$·day, most preferably 15 g/m$^2$·day, and particularly most preferably 10 g/m$^2$·day. A moisture permeability of the substrate film exceeding the upper limits may lead to deformation of a panel under conditions of high humidity, or a reduction in contrast due to degradation of anti-reflection performance when the image display device is left under conditions of high humidity for a long time. The lower limit of moisture permeability is preferably 0.01 g/m$^2$·day, and more preferably 0.1 g/m$^2$·day. Reducing the moisture permeability to less than the lower limits requires the substrate film to be thicker, which is contrary to the demand for thinner image display devices, or may increase costs for the need to separately provide a barrier layer.

The resin for the substrate film is, although not particularly limited to, preferably polyester, copolymerized polyester, acrylic, modified acrylic, and cyclic polyolefin, with polyester being more preferable. Polyester is preferably polyethylene terephthalate (PET) or polyethylene naphthalate (PEN). Polyethylene terephthalate or polyethylene naphthalate may be copolymerized as long as the copolymerization amount is 10 mol % or less (the total amount of the acid component and the total amount of the diol component with each taken as 100 mol %). The copolymerization amount is more preferably 5 mol % or less, and particularly preferably 3 mol % or less. The lower limit of the copolymerization amount is preferably 0.1 mol %, and more preferably 0.5 mol %. The copolymerization amount includes the amount of diethylene glycol produced as a by-product in polymerization.

In-Plane Retardation of Substrate Film

The substrate film may be an optically isotropic film. Examples of the resin that constitutes the substrate film include copolymerized polyester, acrylic, modified acrylic, and cyclic polyolefin. The substrate film composed of an optically isotropic film has an in-plane retardation (Re) of preferably 200 nm or less, more preferably 150 nm or less, still more preferably 100 nm or less, and particularly preferably 70 nm or less. An in-plane retardation exceeding 200 nm may cause coloring or iridescent color unevenness (rainbow unevenness) when an image is observed through polarized sunglasses or observed from an angle even with the naked eye.

To increase the mechanical strength of the substrate film, a stretched film is preferably used. If a stretched film is used, the stretched film is preferably polyester, and particularly preferably PET or PEN.

If the substrate film is a stretched film of PET or PEN, the substrate film has an in-plane retardation of preferably 1000 nm or more. Reducing the in-plane retardation to less than 1000 nm requires the film to be thinner than necessary, possibly resulting in failure to achieve mechanical strength, or requires a high level of stretching control by biaxial stretching, possibly resulting in reduced productivity.

In the present invention, although the reflection reduction layer, described later, reduces coloring or iridescent color unevenness, it is preferable to further increase the in-plane retardation of the substrate film in order to more effectively reduce coloring or iridescent color unevenness.

Methods for reducing coloring by a stretched film include (A) a method for decreasing the difference between the refractive index in the direction of the transmission axis of a polarizing element (the direction perpendicular to the extinction axis) and the refractive index in the same direction of the substrate film, and (B) a method for increasing the in-plane retardation of the substrate film.

In method (A), a preferable lower limit of the in-plane retardation is 1500 nm, a more preferable lower limit of the in-plane retardation is 2000 nm, a still more preferable lower limit is 2500 nm, and a particularly preferable lower limit is 3000 nm.

In method (A), the angle made by the transmission axis of the polarizing element and the direction of the phase advance axis of the substrate film is preferably 10 degrees or less, more preferably 7 degrees or less, still more preferably 5 degrees or less, and particularly preferably 3 degrees or less.

In method (A), the difference between the refractive index in the direction of the transmission axis of the polarizing element and the refractive index in the direction of the phase advance axis of the substrate film is preferably 0.15 or less, more preferably 0.12 or less, still more preferably 0.11 or less, and particularly preferably 0.1 or less.

When the polarizing element is iodine-adsorbed stretched polyvinyl alcohol, and a PET film is used as a substrate film, the refractive index (nx) of the PET film in the phase advance axis direction is preferably 1.53 or more and 1.62 or less. The refractive index (nx) preferably 1.61 or less, more preferably 1.60 or less, still more preferably 1.59 or less, and yet more preferably 1.58 or less.

In method (B), the lower limit of the in-plane retardation is preferably 3000 nm, more preferably 4000 nm, still more preferably 4500 nm, and particularly preferably 5000 nm.

An in-plane retardation less than the lower limits makes it likely for iridescent color unevenness to occur when an image is observed from a diagonal direction.

In order to effectively reduce the refractive index in the direction of the phase advance axis of the PET film or increase in-plane retardation, it is preferable to increase uniaxial stretchability and increase the difference between the refractive index in the direction of the phase advance axis and the refractive index in the direction of the slow axis.

The difference (ny−nx) between the refractive index (nx) in the direction of the phase advance axis of a substrate film and the refractive index (ny) in the direction of the slow axis is preferably 0.05 to 0.2. The lower limit of the difference between the refractive index in the direction of the phase advance axis and the refractive index in the direction of the slow axis is more preferably 0.06, still more preferably 0.07, and particularly preferably 0.08.

The upper limit of the difference between the refractive index in the direction of the phase advance axis and the refractive index in the direction of the slow axis is more preferably 0.17, still more preferably 0.15, and particularly preferably 0.13.

The upper limit of the retardation of the substrate film is preferably 30000 nm, more preferably 15000 nm, still more preferably 10000 nm, and particularly preferably 9000 nm. A substrate film having a retardation exceeding the upper limits may not substantially provide an effect for further improving visibility; rather, a substrate film having retardation exceeding the upper limits must be thicker, which may increase the thickness of the image display device.

The retardation of the substrate film can be determined by measuring the refractive index and thickness of two axis directions, or also determined with a commercially available automatic birefringence measurement device, such as a KOBRA-21ADH (Oji Scientific Instruments).

The ratio of the in-plane retardation (Re) to the retardation (Rth) in the thickness direction of the substrate film is preferably within a specific range. The phase difference in the thickness direction refers to the average of the phase differences obtained by multiplying each of two birefringences ΔNxz and ΔNyz of the film observed from the cross-section in the thickness direction by film thickness d. The smaller the difference between the in-plane retardation and the retardation in the thickness direction is, the more isotropic the action of birefringence according to the observation angle is. Thus, the change in retardation due to an observation angle becomes smaller. Thus, it is thought that iridescent mottling due to the observation angle less likely to occur.

The ratio of the in-plane retardation to the retardation in the thickness direction (Re/Rth) of the substrate film is preferably 0.200 or more, more preferably 0.400 or more, still more preferably 0.500 or more, and particularly preferably 0.600 or more. The larger the ratio of the in-plane retardation to the retardation in the thickness direction (Re/Rth) is, the more isotropic the action of birefringence is. Thus, iridescent mottling due to the observation angle is less likely to occur. The ratio of the in-plane retardation to the retardation in the thickness direction (Re/Rth) is 2.0 in a perfectly uniaxial (uniaxially symmetric) film. However, as mentioned above, the mechanical strength in the direction perpendicular to the orientation direction decreases significantly as the film approaches perfect uniaxiality (uniaxial symmetry).

The ratio of the in-plane retardation to the retardation in the thickness direction (Re/Rth) of the substrate film is also preferably 1.5 or less, more preferably 1.2 or less, and still more preferably 1.0 or less.

Nz Coefficient

The substrate film preferably has an Nz coefficient represented by |ny−nz|/|ny−nx| of 1.7 or less. The Nz coefficient can be determined as follows. The orientation axis direction of a film is determined with a molecular orientation analyzer (MOA-6004 molecular orientation analyzer, produced by Oji Scientific Instruments). The refractive index of two axes, which are in the orientation axis direction and the direction perpendicular to the orientation axis direction (ny, nx, ny>nx), and the refractive index (nz) in the thickness direction are measured with an Abbe refractometer (NAR-4T, produced by Atago Co., Ltd., measurement wavelength: 589 nm). The thus-obtained nx, ny, and nz are assigned to the formula represented by |ny−nz|/|ny−nx| to determine the Nz coefficient.

A substrate film having an Nz coefficient exceeding 1.7 may have iridescent mottling, depending on the angle when an image display device is observed from an oblique direction. The Nz coefficient is more preferably 1.65 or less, and still more preferably 1.63 or less. The lower limit of the Nz coefficient is 1.20. This is because a film with an Nz coefficient of less than 1.20 is technically difficult to produce. To maintain the mechanical strength of the film, the lower of the Nz coefficient is preferably 1.30 or more, more preferably 1.40 or more, and still more preferably 1.45 or more.

Degree of Plane Orientation

The substrate film preferably has a degree of plane orientation represented by (nx+ny)/2−nz of a specific value or less. The values of nx, ny, and nz are determined in the same manner as for the Nz coefficient. The substrate film has a degree of plane orientation of preferably 0.13 or less, more preferably 0.125 or less, and still more preferably 0.12 or less. A degree of plane orientation exceeding 0.13 may lead to iridescent mottling observed, depending on the angle when an image display device is observed from an oblique direction. A degree of plane orientation of less than 0.08 may lead to fluctuation in film thickness, possibly causing non-uniform retardation in the film plane.

The lower limit of the thickness of the substrate film is preferably 10 μm, more preferably 20 μm, still more preferably 30 μm, and particularly preferably 35 μm. A substrate film thickness of less than the lower limits may not be able to achieve preferable in-plane retardation. The upper limit of the substrate film thickness is preferably 500 μm, more preferably 200 μm, still more preferably 100 μm, and particularly preferably 90 μm. A substrate film thickness exceeding the upper limits may result in a thick image display device.

To suppress the degradation of the dichroic pigment used in the polarizing element, the substrate film preferably has a light transmittance of 20% or less at a wavelength of 380 nm. The light transmittance at a wavelength of 380 nm is more preferably 15% or less, still more preferably 10% or less, and particularly preferably 5% or less. A light transmittance of 20% or less can suppress alteration of optical functional pigments due to UV light. Transmittance refers to a value measured in the direction perpendicular to the plane of the film, and can be measured with a spectrophotometer (e.g., U-3500, Hitachi High-Tech Science Corporation).

To reduce the transmittance of the substrate film at a wavelength of 380 nm to 20% or less, it is preferable to adjust the type and concentration of an UV absorber and the thickness of the film accordingly. The UV absorber for use in the present invention is a known substance. UV absorbers include organic UV absorbers and inorganic UV absorbers, with organic UV absorbers being preferable from the standpoint of transparency. Organic UV absorbers include benzotriazole absorbers, benzophenone absorbers, cyclic imino ester absorbers, and combinations thereof. However, organic UV absorbers are not limited to these absorbers as long as an absorber for use has an absorbance within the ranges described above. However, from the standpoint of durability, the UV absorber is particularly preferably a benzotriazole absorber, or a cyclic imino ester absorber. Two or more UV absorbers used in combination can absorb UV rays with different wavelengths simultaneously, thus further increasing the UV light absorption effect.

It is also a preferable embodiment to add various additives other than catalysts in addition to the UV absorber, to the extent that the additives do not interfere with the effects of the present invention. Examples of additives include inorganic particles, heat-resistant polymeric particles, alkali metal compounds, alkali earth metal compounds, phosphorus compounds, antistatic agents, lightfastness agents, flame retardants, heat stabilizers, antioxidants, anti-gelling agents, and surfactants. To achieve high transparency, it is preferred that a polyester substrate film substantially contain no particles. The phrase "substantially contain no particles" means, for example, that in the case of inorganic particles, the content of inorganic elements quantified by X-ray fluorescence analysis is 50 ppm or less, preferably 10 ppm or less, and particularly preferably a detection limit or less.

Method for Producing Substrate Film

A film for the substrate can be stretched to impart a predetermined lane retardation, the film. The stretching can be uniaxial or biaxial as long as properties are imparted. The slow axes of the substrate film may be in the longitudinal direction, in the direction perpendicular to the longitudinal direction, or in the diagonal direction of the substrate film. "Longitudinal direction" as used here refers to the running direction when the film is continuously produced. The angle made by the longitudinal direction and the slow axis of the substrate film is preferably 10 degrees or less, particularly preferably 7 degrees or less, when the slow axis is in the longitudinal direction of the substrate film. When the slow axis of the substrate film is perpendicular to the longitudinal direction of the substrate film, the angle made by the longitudinal direction of the substrate film and the slow axis is preferably 80 to 100 degrees, and particularly preferably 83 to 97 degrees. When the slow axis is in a diagonal direction, the angle is preferably within the range of 35 to 55 degrees. The deviation of the slow axis of the substrate film is preferably within 15 degrees, more preferably within 10 degrees, still more preferably within 8 degrees, and particularly preferably within 5 degrees from the direction perpendicular to the longitudinal direction. A deviation exceeding these ranges may lead to uneven brightness of the screen when an image is observed with polarized sunglasses.

Stretching conditions are described in detail below with a PET substrate film whose slow axis is in the direction perpendicular to the longitudinal direction as an example.

Molten PET is extruded onto a cooled roll to obtain an unstretched original film. The film is held with clips at its ends and guided to a tenter. After preheating, the film is stretched in the transverse direction while being heated. Before stretching in the transverse direction, the film may be stretched in the longitudinal direction with continuous rolls. The film may also be biaxially stretched simultaneously. The longitudinal stretching temperature and the transverse stretching temperature are preferably 80 to 130° C., and particularly preferably 90 to 120° C. The longitudinal draw ratio is preferably 1.0-fold to 3.5-fold, and particularly preferably 1.0-fold to 3.0-fold. The transverse draw ratio is preferably 2.5-fold to 6.0-fold, and particularly preferably 3.0-fold to 5.5-fold. To control the retardation so as to fall within the above ranges, it is preferable to control the ratio of the longitudinal draw ratio to the transverse draw ratio. Due to the difficulty in increasing retardation, an overly small difference between the longitudinal draw ratio and the transverse draw ratio is not preferable. Setting a low stretching temperature is also preferable to increase retardation. In the subsequent heat treatment, the treatment temperature is preferably 100 to 250° C., and particularly preferably 180 to 245° C.

To obtain a substrate film having the slow axis in the longitudinal direction, longitudinal stretching is preferably performed with continuous rolls. Transverse stretching may be performed before the longitudinal stretching step.

The angle made by the main orientation axis of the substrate film with the longitudinal direction or the direction perpendicular to the longitudinal direction is preferably 20 degrees or less, more preferably 15 degrees or less, particularly preferably 10 degrees or less, and most preferably 5 degrees or less. An angle exceeding 20 degrees may lead to a large change in brightness, depending on the angle at which an image is observed through, for example, polarized sunglasses. When the film is stretched in the longitudinal direction, the main orientation direction is in the longitudinal direction; thus, the angle is the angle made by the main orientation axis and the longitudinal direction. When the film is stretched in the width direction, the angle is the angle made by the main orientation axis and the direction perpendicular to the longitudinal direction.

Easy-to-adhere Layer

The substrate film may be provided with an easy-to-adhere layer to improve adhesiveness of the film to the reflection reduction layer or the polarizing element. The resin for use in the easy-to-adhere layer includes polyester resin, polyurethane resin, polycarbonate resin, and acrylic resin; and the resin is preferably polyester resin, polyester polyurethane resin, polycarbonate polyurethane resin, and acrylic resin. If polyvinyl alcohol is used as an adhesive for adhering the film to the polarizing element, water-soluble resin, such as polyvinyl alcohol, may be further added.

The easy-to-adhere layer is preferably crosslinked. Crosslinking agents include isocyanate compounds, melamine compounds, epoxy resin, and oxazoline compounds. It is also a useful means of improving adhesion to add a resin similar to the resin for use in oriented layers or polarizing films, such as polyvinyl alcohol, polyamide, polyimide, and polyamide-imide.

The easy-to-adhere layer can be formed by applying an aqueous coating composition containing these resins optionally with a crosslinking agent, particles, and like components onto a substrate film and drying it. Examples of particles for use are those described above for the substrate.

The easy-to-adhere layer may be formed off-line on a stretched substrate, but preferably formed in-line during the film-forming step. In the case of in-line formation, the coating may be applied either before longitudinal stretching or before transverse stretching; however, it is preferred that a coating composition be applied immediately before transverse stretching and dried and cross-linked in preheating, heating and heat treatment steps using a tenter.

When in-line coating is performed with rolls immediately before longitudinal stretching, it preferred that the film be dried with a vertical dryer after coating, and then guided to stretching rolls. The coating amount of the easy-to-adhere layer is preferably 0.01 to 1.0 g/m², and more preferably 0.03 to 0.5 g/m².

Reflection Reduction Layer

A reflection reduction layer is preferably provided on the surface of the substrate film opposite the surface on which the polarizing element is stacked. The reflection reduction layer can reduce iridescent color unevenness even in films with phase differences, such as polyester.

The upper limit of the reflectance measured from the reflection reduction layer side of the substrate film is preferably 5%, more preferably 4%, still more preferably 3%, particularly preferably 2%, and most preferably 1.5%. A reflectance exceeding the upper limits may make it likely for iridescent color unevenness to be recognized or may decrease color reproducibility.

The lower limit of the reflectance is, although preferably not limited to, preferably 0.01%, and more preferably 0.1% from a practical aspect.

There are various types of reflection reduction layers, such as low-reflective layers, anti-reflective layers, and anti-glare layers.

Low-Reflective Layer

The low-reflective layer has a function of reducing reflectance reducing the difference in the refractive index between the substrate film and air by adding a layer with a low refractive index (low-refractive-index layer) to the surface of the substrate film.

In low-reflective layers, the upper limit of reflectance is preferably 5%, more preferably 4%, and still more preferably 3%.

In low-reflective layers, the lower limit of reflectance is preferably 0.8%, and more preferably 1%. In reality, it is difficult to achieve less than 0.8% by simply reducing the difference in refractive index between the substrate film and air by using a low-refractive-index layer.

Anti-Reflective Layer

The anti-reflective layer controls reflection by controlling the thickness of the low-refractive-index layer to allow the reflected light of the upper interface of the low-refractive-index layer (the interface between the low-refractive-index layer and air) to interfere with the reflected light of the lower interface of the low-refractive-index layer (e.g., the interface between the substrate film and the low-refractive-index layer). In this case, the low-refractive-index layer preferably has a thickness of around a value represented by the wavelength of visible light (400 to 700 mn)/(the refractive index of the low-refractive-index layer×4).

It is also a preferable embodiment to provide a high-refractive-index layer between the anti-reflective layer and the substrate film. Two or more low-refractive-index layers or high-refractive-index layers may be provided to further enhance the anti-reflection effect by multiple interference.

It is also preferable to make the surface a moth-eye structure as another form of the anti-reflective layer. A moth-eye structure refers to a layer that is provided with an uneven structure with a cycle less than the wavelength of visible light at the interface between the layer and air and that prevents reflection by artificially and continuously changing the refractive index of the interface.

In the anti-reflective layer, the upper limit of reflectance is preferably 2%, more preferably 1.5%, still more preferably 1.2%, and particularly preferably 1%.

Low-Refractive-Index Layer

The refractive index of the low-refractive-index layer is preferably 1.45 or less, and more preferably 1.42 or less. The refractive index of the low-refractive-index layer is preferably 1.20 or more, and more preferably 1.25 or more. The refractive index of the low-refractive-index layer refers to a value measured at a wavelength of 589 nm.

The thickness of the low-refractive-index layer is not limited, and may be set as appropriate typically from the range of about 30 nm to 1 μm. For the purpose of further decreasing reflectance by offsetting the reflection on the surface of the low-refractive-index layer with the reflection at the interface between the low-refractive-index layer and inner layers (e.g., the substrate film, hard coating layer, and optical isotropic layer), the thickness of the low-refractive-index layer is preferably 70 to 120 nm, and more preferably 75 to 110 nm.

The low-refractive-index layer is preferably, for example, (1) a layer formed of a resin composition containing a binder resin and low-refractive-index particles, (2) a layer formed of a fluorine-based resin that is a low-refractive-index resin, (3) a layer formed of a fluorine-based resin composition containing silica or magnesium fluoride, or (4) a thin film of a low-refractive-index substance such as silica or magnesium fluoride.

The binder resin contained in the resin composition of (1) above may be a resin such as polyester, polyurethane, polyamide, polycarbonate, or acrylic, without particular restriction. Of these, acrylic is preferable, and those obtained by polymerizing (cross !inking) a photopolymerizable compound by light irradiation are preferable.

The photopolymerizable compound includes photopolymerizable monomers, photopolymerizable oligomers, and photopolymerizable polymers, which can be adjusted and used as appropriate. The photopolymerizable compound is preferably a combination of a photopolymerizable monomer with a photopolymerizable oligomer or photopolymerizable polymer.

Photopolymerizable Monomer

The photopolymerizable monomer refers to those that have a weight average molecular weight of less than 1000. The photopolymerizable monomer is preferably a polyfunctional monomer having two (i.e., bifunctional) or more photopolymerizable functional groups. In the present specification, "weight average molecular weight" refers to a value determined by dissolving a monomer in a solvent, such as THF, and performing polystyrene conversion by known gelpermeation chromatography (GPC).

Examples of polyfunctional monomers include tripropylene glycol di(meth)acrylate, diethylene glycol di(meth)acrylate, dipropylene glycol di(meth)acrylate, pentaerythritol tri(meth)acrylate, pentaerythritol tetra(meth)acrylate, dipentaerythritol hexa(meth)acrylate, 1,6-hexanediol di(meth)acrylate, neopentyl glycol di(meth)acrylate, trimethylolpropane tri(meth)acrylate, ditrimethylolpropane tetra(meth)acrylate, dipentaerythritol penta(meth)acrylate, tripentaerythritol octa(meth)acrylate, tetrapentaerythritol deca(meth)acrylate, isocyanuric acid tri(meth)acrylate, isocyanuric acid di(meth)acrylate, polyester tri(meth)acrylate, polyester di(meth)acrylate, bisphenol di(meth)acrylate, diglycerol tetra(meth)acrylate, adamantyl di(meth)acrylate, isobornyl di(meth)acrylate, dicyclopentane di(meth)acrylate, tricyclodecane di(meth)acrylate, and those obtained by modifying these monomers with PO, EO, etc.

Of these, from the standpoint of obtaining a functional layer with a high degree of hardness, pentaerythritol triacrylate (PETA), dipentaerythritol hexaacrylate (DPHA), pentaerythritol tetraacrylate (PETTA), and dipentaerythritol pentaacrylate (DPPA) are preferable.

Photopolymerizable Oligomer

The photopolymerizable oligomer refers to those that have a weight average molecular weight of 1000 or more and less than 10000. The photopolymerizable oligomer is preferably a polyfunctional oligomer having two or more functional groups. Examples of polyfunctional oligomers include polyester (meth) acrylate, urethane (meth) acrylate, polyester-urethane (meth)acrylate, polyether (meth)acrylate, polyol (meth)acrylate, melamine (meth)acrylate, isocyanurate (meth)acrylate, and epoxy (meth) acrylate.

Photopolymerizable Polymer

The photopolymerizable polymer refers to those that have a weight average molecular weight of 10000 or more, and the weight average molecular weight is preferably 10000 or more and 80000 or less, and more preferably 10000 or more and 40000 or less. A photopolymerizable polymer having a weight average molecular weight exceeding 80000 becomes less suitable for coating due to its high viscosity, and may lead to a deteriorated appearance of the obtained substrate film. The photopolymerizable polymer is preferably a polyfunctional polymer having two or more functional groups. Examples of polyfunctional polymers include urethane (meth)acrylate, isocyanurate (meth)acrylate, polyester-urethane (meth)acrylate, and epoxy (meth)acrylate.

A coating agent may contain a polymerization initiator, a catalyst for a crosslinking agent, a polymerization inhibitor, an antioxidant, a UV absorber, a leveling agent, and a surfactant, in addition to the components above.

The low-refractive-index particles contained in the resin composition of (1) above may be silica particles (e.g., hollow silica particles), magnesium fluoride particles, etc. Of these, hollow silica particles are preferable. Hollow silica particles can be made, for example, by the production method described in the Examples of JP2005-099778A.

The primary particles of the low-refractive-index particles have an average particle size of preferably 5 to 200 nm, more preferably 5 to 100 nm, and still more preferably 10 to 80 nm.

The low-refractive-index particles are more preferably those surface-treated with a silane coupling agent, and particularly preferably those surface-treated with a silane coupling agent containing (meth)acryloyl groups.

The content of the low-refractive-index particles in the low-refractive-index layer is preferably 10 to 250 parts by mass, more preferably 50 to 200 parts by mass, and still more preferably 100 to 180 parts by mass, per 100 parts by mass of the binder resin.

The fluorine-based resin for use in (2) may be a polymerizable compound having a fluorine atom at least in its molecule or a polymer of the polymerizable compound. The polymerizable compound is, although not particularly limited to, for example, preferably a polymerizable compound having a curing reactive group such as a photopolymerizable functional group or a thermosetting polar group. The polymerizable compound may be a compound having these multiple curing reactive groups at the same time. Unlike this polymerizable compound, the polymer has no such curing reactive groups.

For example, the compound having a photopolymerizable functional group for use may be selected from a wide range of fluorine-containing monomers having an ethylenically unsaturated bond.

The low-refractive-index layer preferably contain a known polysiloxane-based or fluorine-based antifouling agent for the purpose of improving fingerprint resistance. Examples of preferable polysiloxane-based antifouling agents include polyether-modified polydimethylsiloxane having an acrylic group, polyether-modified dimethylsiloxane, polyester-modified dimethylsiloxane having an acrylic group, polyether-modified polydimethylsiloxane, polyester-modified polydimethylsiloxane, and aralkyl-modified polymethylalkylsiloxane. The fluorine-based antifouling agent preferably has a substituent that contributes to the formation of the low-refractive-index layer or to compatibility with the low-refractive-index layer. The fluorine-based antifouling agent may have one substituent or multiple substituents. The multiple substituents may be identical to or different from each other. Examples of preferable substituents include acryloyl groups, methacryloyl groups, vinyl groups, aryl groups, cinnamoyl groups, epoxy groups, oxetanyl groups, hydroxyl groups, polyoxyalkylene groups, carboxyl groups, and amino groups.

The surface of the low-refractive-index layer may be uneven in order to provide anti-glare properties; however, a smooth surface is also preferable. When the low-refractive-index layer has a smooth surface, the arithmetic mean roughness Ra (JIS B0601:1994) of the surface of the low-refractive-index layer is preferably 20 nm or less, more preferably 5 nm or less, still more preferably 10 nm or less, and particularly preferably 1 to 8 rim. The 10-point average roughness Rz (JIS B0601:1994) of the surface of the low-refractive-index layer is preferably 160 nm or less, and more preferably 50 to 155 nm. To have Ra of the low-refractive-index layer falling within the above ranges, for example, the following method can be used.

Do not use particles having a particle size greater than ½ of the thickness of the low-refractive-index layer contained in the low-refractive-index layer, or reduce the amount of such particles added.

Make the surface roughness of the inner layers (substrate film, high-refractive-index layer, hard coating aver, etc.) lower than that of the low-refractive-index layer.

If the roughness of the substrate film is high, smooth the surface using hard coating layer, a high-refractive-index layer, etc.

High-Refractive-Index Layer

The high-refractive-index layer has a refractive index of preferably 1.55 to 1.85, and more preferably 1.56 to 1.70. The refractive index of the high-refractive-index layer is a value measured at a wavelength of 589 nm.

The high-refractive-index layer has a thickness of preferably 30 to 200 nm, and more preferably 50 to 180 nm. Although the high-refractive-index layer may be a multilayer, the high-refractive-index layer is preferably formed of two layers or less, and more preferably a monolayer. If the high-refractive-index layer is a multilayer, the total thickness of the multiple layers is preferably within the ranges above.

If the high-refractive-index layer is formed of two layers, it is preferable to increase the refractive index of the high-refractive-index layer facing the low-refractive-index layer; specifically, the refractive index of the high-refractive-index layer facing the low-refractive-index layer is preferably 1.60 to 1.85, and the refractive index of the other high-refractive-index layer is preferably 1.55 to 1.70.

The high-refractive-index layer is preferably formed of a resin composition containing high-refractive-index particles and a resin. In particular, the high-refractive-index particles are preferably antimony pentoxide particles (1.79), zinc oxide particles (1.90), titanium oxide particles (2.3 to 2.7), cerium oxide particles (1.95), tin-doped indium oxide particles (1.95 to 2.00), antimony-doped tin oxide particles (1.75 to 1.85), yttrium oxide particles (1.87), zirconium oxide particles (2.10), and the like. The values in parentheses indicate the refractive index of the material of each type of particles. Of these, titanium oxide particles and zirconium oxide particles are preferable.

The high-refractive-index particles for use may be a combination of two or more types of such particles. In particular, in order to prevent aggregation, it is also preferable to add first high-refractive-index particles and second high-refractive-index particles having a lower surface electric charge than the first high-refractive-index particles. The high-refractive-index particles are also preferably surface-treated from the standpoint of dispersibility.

The preferable average particle size of the primary particles of the high-refractive-index particles is the same as that of the low-refractive-index particles.

The content of the high-refractive-index particle is preferably 30 to 400 parts by mass, more preferably 50 to 200 parts, mass, and still more preferably 80 to 150 parts by mass, per 100 parts by mass of the resin.

The resins for use in the high-refractive-index layer are the same as those listed for the low-refractive-index layer, except for fluorine-based resins.

To flatten the low-refractive-index layer, which is placed on the high-refractive-index layer, it preferable that the surface of high-refractive-index layer also be flat. The method used for flattening the high-refractive-index layer may be the same method used to flatten the low-refractive-index layer described above.

The high-refractive-index layer and the low-refractive-index layer can be formed, for example, by applying a resin composition containing a photopolymerizable compound to a substrate film, drying the composition, and then irradiating the resin composition in a film form with light such as UV light to polymerize (crosslink) the photopolymerizable compound.

The resin compositions of the high-refractive-index layer and the low-refractive-index layer may optionally contain a thermoplastic resin, a thermosetting resin, a solvent, and a polymerization initiator. Additionally, the resin compositions may further contain a dispersant, a surfactant, an antistatic agent, a silane coupling agent, a thickening agent, an anti-coloring agent, a coloring agent (pigments and dyes), an antifoaming agent, a leveling agent, a flame retardant, a UV absorber, an adhesion-imparting agent, a polymerization inhibitor, an antioxidant, a surface modifier, and a lubricant.

Anti-Glare Layer

Due to the unevenness provided on the surface to cause diffused reflection, the anti-glare layer prevents the reflection of the shape of the light source and reduces glare when external light is reflected on the surface.

In the surface of the anti-glare layer, a region in which the inclination angle (surface angle) of the anti-glare surface is 0.05° or more preferably accounts 50% or more, more preferably 55% or more, and still more preferably 60% or more.

The upper limit of the percentage of the region in which the surface angle is 0.05° or more is preferably 95% or less, and more preferably 90% or less. A surface angle falling within these ranges can reduce iridescent mottling due to the interference of the anti-glare surface itself.

The root-mean-square slope (R$\Delta$q) of the surface of the anti-glare layer is preferably 0.004 or less.

The kurtosis (Rku) of the surface of the anti-glare layer is preferably 5 or less, more preferably 4 or less, and still more preferably 3 or less. Rku is preferably 2 or more.

The skewness (RSk) of the surface of the anti-glare layer is preferably −1.0 to 1.0, more preferably −0.5 to 0.5, and still more preferably −0.3 to 0.3.

The average inclination angle ($\theta$a) of the surface unevenness of the anti-glare layer is preferably 0.01 to 1.5°, more preferably 0.04 to 1.2°, and still more preferably 0.1 to 0.5°.

The arithmetic mean roughness (Ra) of the surface unevenness of the anti-glare layer is preferably 0.02 to 0.25 µm, more preferably 0.02 to 0.15 µm, and still more preferably 0.02 to 0.12 µm.

The 10-point average roughness (Rzjis) of the surface unevenness of the anti-glare layer is preferably 0.15 to 2.00 µm, more preferably 0.20 to 1.20 µm, and still more preferably 0.30 to 0.80 µm.

When the values of R$\Delta$q, Rku, RSk, $\theta$a, Ra, and Rzjis are their lower limit or higher, the reflection of external light can be suppressed more effectively. When the values of R$\Delta$q, Rku, RSk, $\theta$a, Ra, and Rzjis are their upper limit or lower, brightness and contrast become excellent.

The average spacing (RSm) of the unevenness of the anti-glare surface is preferably 50 to 600 µm, more preferably 100 to 400 µm, still more preferably 120 to 300 µm, and particularly preferably 150 to 280 µm. If the value of RSm is the lower limit or higher, aggregation can be easily controlled. When the value of RSm is the upper limit or lower, the fineness of images can be reproduced.

R$\Delta$q, Rku, RSk, $\theta$a, Ra, Rzjis, and RSm are calculated from the roughness curve measured with a contact roughness meter in accordance with JIS B0601-1994 or JIS B0601-2001.

For example, the following methods may be used to form the anti-glare layer on the substrate film.

- Apply an anti-glare-layer coating solution containing particles (filler) etc.
- Cure an anti-glare-layer resin with the resin in contact with a mold having an uneven structure.
- Apply an anti-glare-layer resin to a mold having an uneven structure and transfer it onto a substrate film.
- Apply a coating solution that undergoes spinodal decomposition during drying and film formation.

The lower limit of the thickness of the anti-glare layer is preferably 0.1 µm, and more preferably 0.5 µm. The upper limit of the thickness of the anti-glare layer is preferably 100 µm, more preferably 50 µm, and still more preferably 20 µm.

The refract index of the anti-glare layer is preferably 1.20 to 1.80, and more preferably 1.40 to 1.70. If a low-reflection effect is sought by decreasing the refractive index of the anti-glare layer itself, the refractive index of the anti-glare layer is preferably 1.20 to 1.45, and more preferably 1.25 to 1.40. If a low-refractive-index layer, described later, is provided on the anti-glare layer, the refractive index of the anti-glare layer is preferably 1.50 to 1.80, and more preferably 1.55 to 1.70. The refractive index of the ant glare layer refers to a value measured at a wavelength of 589 nm.

The following describes an example of the anti-glare layer containing fine particles and a binder resin.

Fine Particles

The fine particles may be either fine inorganic particles or fine organic particles. Of these, fine inorganic particles are preferable. Preferable inorganic particles include those listed for the low-refractive-index layer and the high-refractive-index layer, and also alumina particles.

The fine inorganic particles are preferably surface-treated with a compound such as a silane compound or a silazane compound. The fine inorganic particles are preferably aggregated particles, and particularly preferably fumed silica particles. The fine inorganic particles may also be used to adjust the refractive index of the anti-glare layer. To achieve a high refractive index, the fine inorganic particles for use are preferably hose listed for the high-refractive-index layer;

to achieve a low refractive index, the fine inorganic particles for use are preferably those listed or the low-refractive-index layer. To impart antistatic properties to the anti-glare layer, fine antimony pentoxide particles, fine tin-doped indium oxide particles, fine antimony-doped tin oxide particles, and the like are preferably used.

Examples of fine organic particles include polystyrene beads, melamine resin beads, acrylic beads, acrylic-styrene beads, silicone beads, benzoguanamine beads, benzoguanamine-formaldehyde-condensed beads, polycarbonate beads, and polyethylene beads.

The fine organic particles are preferably three-dimensionally crosslinked, and the degree of crosslinking and hardness can be used to adjust the unevenness.

For the purpose of adjusting the refractive index, the content of fine particles in the anti-glare layer is preferably within the ranges described for the low-refractive-index layer or the high-refractive-index layer. Simply for the formation of unevenness, the content of fine particles in the anti-glare layer is preferably 0.1 mass % or more and 5.0 mass % or less. The lower limit of the content of fine particles is preferably 0.5 mass % or more, and the upper limit of the content of fine particles is preferably 3.0 mass % or less.

Fine inorganic particles (e.g., fine inorganic-oxide particles) for use as the fine particles have an average primary particle size of preferably 1 nm or more and 100 nm or less. The lower limit of the average primary particle size of the fine inorganic particles is preferably 5 nm or more, and the upper limit of the average primary particle size of the fine inorganic particles is preferably 50 nm or less.

Fine organic particles for use as the fine particles have an average primary particle size of preferably less than 8.0 μm, and more preferably 5.0 μm or less. Fine organic particles for use as the fine particles also have an average primary particle size of preferably 0.5 μm or more, and more preferably 1.0 μm or more.

If fine inorganic-oxide particles are used as the fine particles, the aggregates of the fine inorganic-oxide particles have an average particle size of preferably 100 nm or more and 2.0 μm or less. The lower limit is preferably 200 nm or more, and the upper limit is preferably 1.5 μm or less.

The anti-glare-layer coating solution may also contain other resins and various additives described above. The anti-glare-layer coating solution may also contain an anti-fouling agent.

The low-refractive-index layer may be provided with unevenness to form an anti-glare low-reflective layer, or the low-refractive-index layer may be provided on an uneven portion to impart anti-reflection functionality so as to form an anti-glare anti-reflective layer.

Hard Coating Layer

It is also a preferable embodiment to provide a hard coating layer as a lower layer of the reflection reduction layer described above. The hard coating layer has a pencil hardness of preferably H or more, and more preferably 2H or more. The hard coating layer can be provided, for example, by applying and curing a composition solution of a thermosetting resin or a radiation-curable resin.

Thermosetting resins include acrylic resins, urethane resins, phenol resins, urea-melamine resins, epoxy resins, unsaturated polyester resins, silicone resins, and combinations thereof. Thermosetting resin compositions optionally contain a curing agent in addition to these curable resins The radiation-curable resin is preferably a compound having a radiation-curable functional group. Radiation-curable functional groups include ethylenically unsaturated bond groups such as a (meth)acryloyl group, a vinyl group, and an allyl group; an epoxy group; and an oxetanyl group. Of these, a compound having an ethylenically unsaturated bond group is preferable as an ionizing radiation-curable compound, and a compound having two or more ethylenically unsaturated bond groups is more preferable. In particular, a polyfunctional (meth)acrylate compound having two or more ethylenically unsaturated bond groups is still more preferable. The polyfunctional (meth) acrylate compound may be a monomer, an oligomer, or a polymer.

Specific examples of these include those listed above as a binder resin. To achieve hardness as a hard coating, the compound having a radiation-curable functional group contains a bifunctional or higher functional monomer in an amount of preferably 50 mass % or more, and more preferably 70 mass % or more. Additionally, the compound having a radiation-curable functional group contains a trifunctional or her functional monomer in an amount of preferably 50 mass % or more, and more preferably 70 mass % or more. The compound having a radiation-curable functional group can be used alone, or in a combination of two or more.

The hard coating layer has a thickness of preferably 0.1 to 100 μm, and more preferably 0.8 to 20 μm.

The hard coating layer has a refractive index of more preferably 1.45 to 1.70, and still more preferably 1.50 to 1.60. The refractive index of the hard coating layer refers to a value as measured at a wavelength of 589 nm.

To adjust the refractive index of the hard coating layer, the refractive index of the resin can be adjusted; or if particles are added, the refractive index of the particles can be adjusted. The particles are, for example, those listed as examples of particles for the anti-glare layer. In the present invention, the reflection reduction layer, including the hard coating layer, may also be referred to as a "reflection reduction layer."

Antistatic Layer

It is also a preferable embodiment to separately provide an antistatic layer. The antistatic layer is preferably provided between the substrate film and the reflection reduction layer, or on the side of the substrate film where the reflection reduction layer is not provided. The antistatic layer is preferably formed of an antistatic agent and a binder resin. Antistatic agents include quaternary ammonium salts, conductive polymers such as polyaniline and polythiophene, fine conductive high-refractive-index particles such as acicular metallic filler, fine tin-doped indium oxide particles, and fine antimony-doped tin oxide particles, and combinations thereof. The binder resin for use includes polyester, polyurethane, polyamide, and acrylic.

An antistatic agent may be added to the hard coating layer to allow the hard coating layer to function as an antistatic layer. The antistatic agent to be added to the hard coating layer may be a known antistatic agent, and examples include cationic antistatic agents such as quaternary ammonium salts, fine particles such as tin-doped indium oxide (ITO), and conductive polymers. The content of the antistatic agent is preferably 1 to 30 mass % based on the total mass of all solids of the hard coating layer.

Polarizing Element

Examples of polarizing elements for use in the polarizer include, without any particular limitation, a polarizing element formed by adsorbing iodine or an organic dichroic pigment on uniaxially stretched polyvinyl alcohol (PVA), a polarizing element formed by allowing a liquid-crystal compound and an organic dichroic pigment to align, a liquid-crystal polarizing element formed of a liquid-crystal dichroic pigment, and a polarizing element of a wire grid.

A polarizing element in film a form, prepared by adsorbing iodine or an organic dichroic pigment on uniaxially stretched polyvinyl alcohol (PVA), and a substrate film wound in a roll form, can be bonded together by using an adhesive such as PVA-based adhesive or an UV-curable adhesive, or a tackifier, and then rolled up. This type of polarizing element has a thickness of preferably 5 to 50 µm, more preferably 10 to 30 µm, and particularly preferably 12 to 25 µm. The thickness of the adhesive or the tackifier is preferably 1 to 10 µm, and more preferably 2 to 5 µm.

Another preferable polarizing element for use is one obtained by applying PVA to an unstretched substrate such as PET or polypropylene, uniaxially stretching the PVA with the substrate, and adsorbing iodine or an organic dichroic pigment on it. In this type of polarizing element, a substrate film and the polarizing element can be bonded together by adhering the polarizing surface of the polarizing element stacked on a substrate (the surface on which the substrate is not stacked) and the substrate film together by an adhesive or tackifier, and then peeling off the substrate used in preparing the polarizing element. In this case also, it is preferable to adhere and roll up the resulting polarizing element. This type of polarizing element has a thickness of preferably 1 to 10 µm, more preferably 2 to 8 µm, and particularly preferably 3 to 6 µm. The thickness of the adhesive or the tackifier is preferably 1 to 10 µm, and more preferably 2 to 5 µm.

In the case of a liquid-crystal polarizing element, the polarizer can be formed by stacking a film including a polarizing element formed of a liquid-crystal compound and an organic dichroic pigment oriented on a substrate film; or applying a coating solution containing a liquid-crystal dichroic pigment to the substrate film according to the present invention, drying it, and curing it with light or heat to stack a polarizing element. Methods for orienting the liquid-crystal polarizing element include a method in which the surface of an object to be coated is subjected to rubbing, and a method in which a liquid-crystal polarizing element is irradiated with polarized UV light to orient the polarizing element while it is cured. The surface of the substrate film according to the present invention may be directly subjected to rubbing and then have a coating solution applied, or a coating solution may be directly applied to the substrate film, and then the solution may be irradiated with polarized UV light. Another preferable method is to provide an oriented layer to the substrate film of the present invention before providing the liquid-crystal polarizing element (i.e., to stack a liquid-crystal polarizing element to the substrate film according to the present invention via the oriented layer. The method for providing the oriented layer is as follows.

A method in which polyvinyl alcohol or its derivative, polyimide or its derivative, acrylic resin, a polysiloxane derivative, etc. is applied, and the surface is subjected to rubbing to form an oriented layer (rubbing-oriented layer).

A method in which a costing solution containing a polymer or monomer having a photo-reactive group (e.g., a cinnamoyl group and a chalcone group) and a solvent is applied, and the coated solution is irradiated with polarized UV light to make alignment and cure the solution, thereby forming an oriented layer (photo-oriented layer).

The substrate film and the polarizing element can also be adhered together by providing a liquid-crystal polarizing element to a releasable film according to the methods above, adhering the polarizing surface of the liquid-crystal polarizing element to the substrate film of the present invention with an adhesive or tackifier, and then peeling off the releasable film.

The liquid-crystal polarizing element has a thickness of preferably 0.1 to 7 µm, more preferably 0.3 to 5 µm, and particularly preferably 0.5 to 3 µm. The thickness of the adhesive or the tackifier is preferably 1 to 10 µm, and more preferably 2 to 5 µm.

If the polarizing element is of wire grid, fine conductive wire can be provided to the substrate film. If fine grooves are required to provide the fine conductive wire, a separate layer for the grooves may be provided.

The angle made by the transmission axis of the polarizing element with the slow axis of the substrate film is not particularly limited. However, if linearly polarized light transmitted from the polarizing element is to be emitted to the viewing side as is, the transmission axis of the polarizing element and the slow axis of the substrate film are preferably parallel or Perpendicular to each other. "Parallel or perpendicular" means that a deviation of up to preferably ±10°, more preferably ±7°, and particularly preferably ±5° from 0° or 90° is permissible. Due to the axes being parallel or perpendicular to each other, the polarizing element and the substrate film can be easily adhered and rolled up while being in their roll form.

Additionally, if linearly polarized light transmitted from the polarizing element is to be eliminated to prevent blackout when the screen is viewed through polarized sunglasses, the angle made by the transmission axis of the polarizing element and the slow axis of the substrate film is preferably 20 to 70°, more preferably 25 to 65°, still more preferably 30 to 60°, and particularly preferably 35 to 55°. To make such a diagonal direction, the polarizing element and the substrate film may be cut to a sheet form and adhered together. If they are to be adhered in their roll form, the substrate film may be stretched in the diagonal direction, or the portion aligned in a diagonal direction at the end portion produced by a bowing phenomenon during the stretching of the substrate film may be cut and used.

The polarizing element is provided on the surface of the substrate film opposite the surface on which the reflection reduction layer is provided. The polarizing element may be provided after the reflection reduction layer is provided on the substrate film, or the reflection reduction layer may be provided after the polarizing element is provided on the substrate film. However, the former is preferable because it is less likely to damage the polarizing element, and is easier to handle the reflection reduction layer when coating the reflection reduction layer.

If the angle made by the transmission axis of the polarizing element and the slow axis of the substrate film is parallel or perpendicular to each other, blackout occurs when an image is observed through polarized sunglasses. However, blackout may be prevented by placing a λ/4 phase-difference layer in a diagonal direction between the polarizing element and the substrate film or between the substrate film and the reflection reduction layer in this case, it is also preferable that the slow axis direction of the λ/4 phase-difference layer is preferably at 30 to 60 degrees, more preferably 35 to 55 degrees, and particularly preferably 40 to 50 degrees with respect to the direction of the extinction axis of the polarizing element (the direction of the absorption axis).

The λ/4 phase-difference layer is provided on the other side of the polarizing element (the side of the polarizing element opposite the side on which the substrate film is stacked). However, the λ/4 phase-difference layer may be provided on the other side of the polarizing element via an optically isotropic polarizing element-protection film such as TAC, or the λ/4 phase-difference layer may be provided directly on the polarizing element. The λ/4 phase-difference directly provided the polarizing element includes the case in which the polarizing element and the λ/4 phase-difference layer are bonded together with an adhesive or tackifier. Alternatively, a protective coating may be provided on the polarizing element, and the λ/4 phase-difference layer may be provided on this protective coating.

λ/4 Phase-Difference Layer

The λ/4 phase-difference layer converts linearly polarized light entering through the polarizing element into circularly polarized light, and converts circularly polarized light reflected by wiring, a glass substrate, etc. in an organic EL image display into linearly polarized light that is deviated by 90 degrees from the incident linearly polarized light. The λ/4 phase-difference layer may be a λ/4 phase-difference layer alone, or may be a composite λ/4 phase-difference layer of a λ/4 phase-difference layer and a λ/2 phase-difference layer. Additionally, for example, a C-plate phase-difference layer may be provided. In the present invention, these composite λ/4 phase-difference layers may also be included in the λ/4 phase-difference layer, and may be referred to as a "λ/4 phase-difference layer."

The λ/4 phase-difference layer may be a stretched film of TAC, COP, polypropylene, acrylic resin, polycarbonate, etc. A λ/4 phase-difference layer formed of a stretched film for use is preferably a film stretched in a diagonal direction, or the portion of a film in which bowing has occurred as stated above.

The λ/4 phase-difference layer may also be a λ/4 phase-difference film formed by providing a λ/4 phase-difference layer composed of a liquid-crystal compound to an optically isotropic film. A preferable example of optically isotropic films is TAC. The thickness of these filmic λ/4 phase-difference layers is preferably 10 to 80 μm, and more preferably 20 to 60 μm.

However, recent years have seen demand for thinner image display devices. Thus, it is a particularly preferable embodiment to directly provide a μ/4 phase-difference layer composed of a liquid-crystal compound to the polarizing element. The method for directly providing a μ/4 phase-difference layer composed of a liquid-crystal compound to a polarizing element includes a method in which a liquid-crystal compound is applied to a polarizing element, and a method in which a phase-difference layer is separately formed on a releasable film, and then transferring this to a polarizing element.

The λ/4 phase-difference layer has an in-plane retardation of preferably 100 to 180 nm, and more preferably 120 to 150 nm. The λ/2 phase-difference layer has an in-plane retardation of preferably 200 to 360 nm, and more preferably 240 to 300 nm.

Transfer of λ/4 Phase-Difference Layer Composed of Liquid-Crystal Compound

In the method of transferring a phase-difference layer composed of a liquid-crystal compound to a releasable film, it is necessary to apply a coating solution containing a liquid-crystal compound to the releasable film, then align the liquid-crystal compound, and immobilizing the compound.

The liquid-crystal compound can be aligned by a method of subjecting tale under layer of the oriented liquid-crystal compound layer (the release surface of the releasable film) to rubbing to impart orientation control functionality, or by a method of applying the liquid-crystal compound to a releasable film and then irradiating it with light such as polarized UV light to directly align the liquid-crystal compound.

Orientation Control Layer

It is also a preferable method to provide an orientation control layer on a releasable film and then provide an oriented liquid-crystal compound layer on the orientation control layer. In the present invention, not only an oriented liquid-crystal compound layer alone but also a combination of an orientation control layer and an oriented liquid-crystal compound layer may be collectively referred to as "oriented liquid-crystal compound layer. The orientation control layer can be any orientation control layer capable of aligning the oriented liquid-crystal compound layer in a desired orientation. Examples of preferable orientation control layers include a rubbing orientation control layer formed by subjecting a resin coating film to rubbing, and a photo-orientation control layer formed by aligning molecules by irradiation with polarized light to produce orientation functionality.

Rubbing Orientation Control Layer

Preferable polymer materials for use in the orientation control layer formed by rubbing include polyvinyl alcohol and its derivatives, polyimide and its derivatives, acrylic resin, and polysiloxane derivatives.

The following describes the method for forming a rubbing orientation control layer. First, a coating solution for rubbing orientation control layers containing a polymer material as described above is applied to the releasable surface of a releasable film, and then the coating is dried by heating to obtain an orientation control layer before being subjected to rubbing. The coating solution for orientation control layers may contain a crosslinking agent.

The solvent for use in the coating solution for rubbing orientation control layers can be any solvent that can dissolve the polymer material. Specific examples include water; alcohols, such as methanol, ethanol, ethylene glycol, isopropyl alcohol, propylene glycol, and cellosolve; ester solvents, such as ethyl acetate, butyl acetate, and y-butyrolactone; ketone solvents, such as acetone, methyl ethyl ketone, cyclopentanone, and cyclohexanone; aromatic hydrocarbon solvents, such as toluene and xylene; and ether solvents, such as tetrahydrofuran and dimethoxyethane. These solvents may be used singly or in combination.

The concentration of the coating solution for rubbing orientation control layers can be adjusted as appropriate according to the type of polymer and the thickness of the orientation control layer to be produced. The concentration is preferably 0.2 to 20 mass %, and particularly preferably 0.3 to 10 mass % on a solids concentration basis. The coating method includes known coating methods, such as gravure coating, die coating, bar coating, and an applicator method, and known printing methods, such as a flexo method.

The temperature for drying by heating is preferably 30 to 110° C., more preferably 50 to 150° C., and still more preferably 70 to 130° C., in the case of PET, although the temperature also depends on the releasable film. A low drying temperature requires a longer drying time, and may thus reduce productivity. An overly high drying temperature may cause the releasable film to be unable to achieve designed optical functionality due to thermal elongation or large thermal shrinkage, or may deteriorate flatness. The time period for drying by heating can be, for example, 0.5 to 30 minutes, preferably 1 to 20 minutes, and more preferably 2 to 10 minutes.

The thickness of the rubbing orientation control layer is preferably 0.01 to 10 μm, more preferably 0.05 to 5 μm, and particularly preferably 0.1 to 1 μm.

Subsequently, rubbing is performed. Rubbing can generally be performed by rubbing the surface of a polymer layer with paper or a cloth in a predetermined direction. Typically, the surface of the orientation control layer is subjected to rubbing with a rubbing roller of brushed fabric, such as nylon, polyester, acrylic, or other fiber. To provide a liquid-crystal compound orientation control layer that aligns in a predetermined direction diagonal to the longitudinal direction of a lengthy film, it is also necessary to set the rubbing direction of the orientation control layer to an angle suitable for it. The angle can be tuned by adjusting the angle made by the rubbing roller and the releasable film, or by adjusting the feeding speed of the releasable film and the rotation speed of the roller.

It is also possible to perform rubbing directly on the releasable surface of the releasable film to impart orientation control functionality to the surface of the releasable film, and this case is also included in the technical scope of the present invention.

Photo-Alignment Control Layer

The photo-orientation control layer refers to an oriented film formed by applying a coating solution containing a polymer or monomer having a photo-reactive group and a solvent to a releasable film, and irradiating the film with polarized light, preferably polarized UV light, to impart an orientation-regulating force to the film. The photo-reactive group refers to a group that produces a liquid-crystal orientation ability upon light irradiation. Specifically, the photo-reactive group refers to those that cause a photoreaction that becomes the origin of the liquid-crystal orientation ability, such as molecular-orientation induction or isomerization reaction caused by light irradiation, dimerization reaction, photo-crosslinking reaction, or photodegradation reaction. Of these photo-reactive groups, those that cause dimerization or photo-crosslinking reactions are preferred in that such groups exhibit excellent alignment and maintain the liquid-crystal state of the λ/4 phase-difference layer. Preferable photo-reactive groups that can cause the reactions described above preferably have an unsaturated bond, in particular a double bond, and particularly preferably a group having at least one selected from the group consisting of a C=C bond, a C=N bond, an N=N bond, and a C=O bond.

Examples of photo-reactive groups having a C=C bond include a vinyl group, a polyene group, a stilbene group, a stilbazole group, a stilbazolium group, a chalcone group, and a cinnamoyl group. Examples of photo-reactive groups having a C=N bond include groups having a structure such as aromatic Schiff bases or aromatic hydrazone. Examples of photo-reactive groups having an N=N bond include an azobenzene group, an azonaphthalene group, an aromatic heterocyclic azo group, a bis-azo group, a formazan group, and those having azoxybenzene as a basic structure. Examples of photo-reactive groups having a C=O bond include a benzophenone group, a coumarin group, an anthraquinone group, and a maleimide group. These groups may have substituents such as an alkyl group, an alkoxy group, an allyl group, an allyloxy group, a cyano group, an alkoxycarbonyl group, a hydroxyl group, sulfonic acid group, and a halogenated alkyl group.

Of these, photo-reactive groups that can cause photodimerization reaction are preferable, and the cinnamoyl group and chalcone group are preferable because these groups require a relatively smaller amount of polarized light irradiation for photo-orientation and make it easier to obtain a photo-orientation control layer excellent in thermal stability and stability over time. Moreover, the polymer having a photo-reactive group is particularly preferably a polymer having a cinnamoyl group so that the end of the polymer side-chain has a cinnamic acid structure. Examples of the structure of the main chain include polyamide, polyamide, (meth)acrylic, polyester, or the like.

Specific examples of orientation control layers include orientation control layers disclosed in JP2006-285197A, JP2007-76839A, JP2007-138138A, JP2007-94071A, JP2007-121721A, JP2007-140465A, JP2007-156439A, JP2007-133184A, JP2009-109831A, JP2002-229039A, JP2002-265541A, JP2002-317013A, JP2003-520878A, JP2004-529220A, JP2013-33248A, JP2015-7702A, or JP2015-129210A.

The solvent for the coating solution for forming a photo-orientation control layer can be any solvent that can dissolve the polymer or monomer having a photo-reactive group. Specific examples include those listed for the method for forming a rubbing orientation control layer. It is also preferable to add a photopolymerization initiator, a polymerization inhibitor, and various stabilizers to the coating solution for forming a photo-orientation control layer. Polymers other than polymers and monomers having a photo-reactive group, or monomers having no photo-reactive group copolymerizable with monomers having a photo-reactive group, may also be added.

Examples of the concentration, coating method, and drying conditions of the coating solution for forming a photo-orientation control layer may be those listed for the method for forming a rubbing orientation control layer. The thickness is also the same as the preferable thickness of the rubbing orientation control layer.

Polarized light is preferably applied from the direction of the plane of the photo-orientation control layer before the photo-orientation control layer is aligned.

The wavelength of polarized light is preferably within the wavelength region in which the photo-reactive group of the polymer or monomer having a photo-reactive group can absorb light energy. Specifically light with a wavelength of 250 to 400 nm is preferable. Examples of light sources for polarization include xenon lamps, high-pressure mercury lamps, super-high-pressure mercury lamps, metal halide lamps, and UV light lasers such as KrF and ArF, with high-pressure mercury lamps, super-high-pressure mercury lamps, and metal halide lamps being preferred.

Polarization can be achieved, for example, by allowing light from a light source as described above to pass through a polarizing element. The direction of polarization can be adjusted by adjusting the polarization angle of the polarizing element. Examples of polarizing elements include polarizing filters, polarizing prisms such as Glan-Thompson and Glan-Taylor, and polarizing elements of wire grid. Preferably, polarized light is substantially parallel light.

The direction of the orientation-regulating force of the photo-orientation control layer can be freely adjusted by adjusting the angle of irradiated polarized light.

Although the irradiation intensity varies depending on the type and amount of the polymerization initiator and resin. (monomer), the irradiation intensity is, for example, preferably 10 to 10000 mJ/cm$^2$, and more preferably 20 to 5000 mJ/cm$^2$ on the basis of 365 nm.

λ/4 Phase-Difference Layer

The λ/4 phase-difference layer is preferably a rod-shaped liquid-crystal compound. The λ/4 phase-difference layer can also be preferably used in combination with a λ/2 phase-difference layer rather than used alone as stated above. The λ/2 phase-difference layer is also preferably a rod-shaped liquid-crystal compound.

The liquid-crystal compound for use in these phase-difference layers is preferably a polymerizable liquid-crystal compound having a polymerizable group, such as a double bond, in terms of being able to secure the orientation state.

Examples of rod-shaped liquid-crystal compounds include rod-shaped liquid-crystal compounds having a polymerizable group disclosed in JP2002-030042A, JP2004-204190A, JP2005-263789A, JP2007-119415A, JP2007-186430A, and JP20011-513360A.

Specific examples of the compounds include the following.

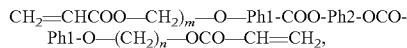

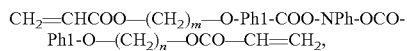

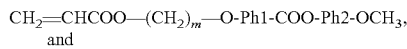

and

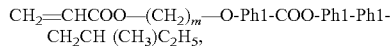

wherein m and n are integers of 2 to 6, and Ph1 and Ph2 are a 1,4-phenyl group (Ph2 may have a methyl group at the 2-position), and NPh is a 2,6-naphthyl group.

These rod-shaped liquid-crystal compounds are commercially available as, e.g., LC242 from BASF, and such compounds can be used.

These rod-shaped liquid-crystal compounds can be used in a combination of two or more kinds at any ratio.

The phase-difference layer can be formed by applying a coating composition for phase-difference layers. The coating composition for phase-difference layers may contain a solvent, a polymerization initiator, a sensitizer, a polymerization inhibitor, a leveling agent, a polymerizable non-liquid-crystal compound, a cross-linking agent, and the like. Examples of these additives can be the same as those explained in the descriptions of the orientation control layer and the liquid-crystal polarizing element.

The coating composition for phase-difference layers is applied to the release surface of a releasable film or an orientation control layer, then dried, heated, and cured to thereby form a phase-difference layer.

Preferable conditions for these steps are also the same as those explained in the descriptions of the orientation control layer and the liquid-crystal polarizing element.

Stacking of λ/4 Phase-Difference Layer and Polarizing Element

Next, regarding the stacking of the λ/4 phase-difference layer and polarizing element, a method for stacking the λ/4 phase-difference layer comprising a liquid-crystal compound to the surface of the polarizing element stacked on the substrate film is mainly explained.

When a λ/4 layer alone is used as the λ/4 phase-difference layer, the angle between the orientation axis (slow axis) of the λ/4 layer and the transmission axis of the polarizing element is preferably 35 to 55 degrees, more preferably 40 to 50 degrees, and even more preferably 42 to 48 degrees. When a λ/4 layer is used in combination with a polarizing element comprising a stretched polyvinyl alcohol film, the extinction axis (absorption axis) of the polarizing element is generally in the longitudinal direction of the long polarizing film. Therefore, when a λ/4 layer is formed on a long oriented film for transfer (mold-releasable film), the liquid-crystal compound is preferably oriented at an angle within the above range, relative to the length direction of the long oriented film for transfer. When the angle of the extinction axis of the polarizing element is different from the above range, the liquid-crystal compound is oriented to achieve the above relationship by taking into account the angle of the transmission axis of the polarizing element.

In the stacking of a λ/4 phase-difference layer and a polarizing element, the λ/4 phase-difference layer of a stacked product for transfer of a phase-difference layer comprising a λ/4 phase-difference layer and a releasable film stacked thereon is bonded to the surface of a polarizing element on which a substrate film is stacked, and then the releasable film is peeled off.

The bonding method can be a method using a known material such as an adhesive or a tackifier. Examples of preferable adhesives include polyvinyl alcohol-based adhesives, UV-curable adhesives such as acrylic or epoxy, and thermosetting adhesives such as epoxy and isocyanate (urethane). Examples of tackifiers include acrylic, urethane-based, and rubber-based tackifiers. Alternatively, an optical transparent adhesive sheet containing no acrylic substrate can also be preferably used.

When a composite λ/4 phase-difference layer comprising a combination of a λ/4 phase-difference layer and a λ/2 phase-difference layer is used, these layers are preferably arranged so that the phase difference of λ/4 is achieved by both layers. More specifically, the angle (θ) between the orientation axis (slow axis) of the λ/2 layer and the transmission axis of the polarizing element is preferably 5 to 20 degrees, and more preferably 7 to 17 degrees. The angle between the orientation axis (slow axis) of the λ/2 layer and the orientation axis (slow axis) of the λ/4 (slow axis) is preferably in the range of 2θ+45°±10°, more preferably in the range of 2θ+45°±5°, and even more preferably in the range of 2θ+45°±3°.

In this case as well, when the composite λ/4 phase-difference layer is used in combination with a polarizing element comprising a stretched polyvinyl alcohol film, the extinction axis (absorption axis) of the polarizing element is generally in the longitudinal direction of the long polarizing film. Therefore, when a λ/2 layer or a λ/4 layer is formed on a long releasable film, the liquid-crystal compound is preferably oriented at an angle relative to the length direction of the long releasable film or a direction perpendicular to the length direction. When the angle of the extinction axis of the polarizing element is different from the above range, the liquid-crystal compound is oriented to achieve the above relationship by taking into account the angle of the transmission axis of the polarizing element.

For these methods and examples of phase-difference layers, refer to JP2008-149577A, JP2002-303722A, WO2006/100830, JP2015-64418A, etc.

Further, in order to reduce changes in coloration when viewed from a diagonal direction, providing a C-plate layer on the λ/4 layer is also a preferable embodiment. The C-plate layer can be a positive or negative C-plate layer, depending on the characteristics of the λ/4 layer and the λ/2 layer.

Examples of stacking methods, for example, in the case of stacking a combination of a λ/4 layer and a λ/2 layer, include a method comprising forming a λ/2 layer to the polarizing element by transfer and then further forming a λ/4 layer on the λ/2 layer by transfer; and a method comprising forming a λ/4 layer and a λ/2 layer in this order on a releasable film and then transferring this stacked product to a polarizing element.

When a C-plate is stacked, various methods can be used. Examples include a method comprising transferring a C-plate onto the λ/4 layer formed on a polarizing element, and a method comprising forming a C-plate layer on a releasable film and then forming a λ/4 layer, or both a λ/2 layer and λ/4 layer, on the C-plate layer and transferring this stacked product.

Protective Layer

A protective layer may be provided on the phase-difference layer to prevent scratching of the phase-difference layer. The protective layer may be, for example, a coating layer of a transparent resin. Examples of the transparent resin include, but are not limited to, polyvinyl alcohol, ethylene-vinyl alcohol copolymers, polyester, polyurethane, polyamide, polystyrene, acrylic resin, epoxy resin, and the like. A crosslinking agent may be added to these resins to form a crosslinked structure. The protective layer may be a hard coat or the like formed by curing a photo-curable composition such as an acrylic. After the protective layer is famed on an oriented film, the protective layer can be subjected to rubbing and an oriented liquid-crystal compound layer can be directly formed thereon without forming an oriented layer thereon.

Organic EL Image Display Device

The anti-reflection circular polarizer of the present invention is preferably used as an anti-reflection circular polarizer for organic EL image display devices.

The organic EL image display device used in the present invention is not particularly limited as long as an organic EL is used as a light emitting element for displaying images. The organic EL element is not particularly limited, and known elements can be used. Examples include a stacked structure of a positive electrode, an organic EL layer, and a negative electrode. The organic EL layer can be configured to comprise a light-emitting layer, an electron injection layer, a hole injection layer, and a transport layer.

The organic EL image display device can be an image display device that uses an organic light-emitting diode as a light emitter and displays full-color images by controlling the light emission intensity, or an image display device that uses a white organic EL light emitter as a backlight source and controls the amount of the transmitted light by a polarizer and a liquid-crystal layer. Among these, an image display device that uses an organic light-emitting diode as a light emitter and displays full-color images by controlling the light emission intensity is preferred. The former type of organic EL image display device is described below.

Examples of organic EL image display devices include
(a) a device that comprises individual organic EL light-emitting elements for red, green, and blue;
(b) a device that emits white light using an organic EL light-emitting element and colors each of red, green, and blue by using color filters, thus emitting each of red, green, and blue; and
(c) a device that comprises an organic EL light-emitting element for a single color (e.g., blue) and emits other colors (e.g., red, green) by color conversion of the light emitted from the organic EL light-emitting element for a single color by using a phosphor or the like. Device (b) may be a device that mixes EL light-emitting organic materials to emit white light (b1), or a device that comprises a single-color (e.g., blue) organic light-emitting element and converts other colors (e.g., red, green) by color conversion using a phosphor or the like to produce white light (b2). Device (c) includes devices that use color filters to cut off intermediate colors by using color filters in order to further improve color purity.

Among these, preferable organic EL image display devices include those having specific emission spectrum characteristics. Organic EL image display devices having such specific emission spectrum characteristic are preferred in view of more effectively reducing coloring and iridescent color unevenness. Further, device (b) or device (c), especially device (b2), is preferred as an object to be combined with the anti-reflection circular polarizer of the present invention because the obtained image has less color intensity loss of each color even when exposed to high humidity and high temperature for a long time.

A preferred emission spectrum is specifically explained below. In order to make a white color, it is sufficient to have light emission in the red, green, and blue wavelength regions. The narrower the peak width in each wavelength region, the wider the color gamut, and the narrower the peak width, the lower the luminous efficiency. The shape of the emission spectrum is designed considering the balance between the required color gamut and luminous efficiency.

The present inventors revealed that when an organic EL spectrum is resolved into normally distributed peaks in the blue, green, and red wavelength regions by curve fitting using the least-squares method of the normal distribution function and combined with an organic EL that optimizes the shape of the normal distribution peaks in the resolved blue, green, and red wavelength regions, coloring or iridescent color unevenness (rainbow unevenness) can be made much less noticeable.

The curve fitting can be performed, for example, by a method comprising reading the peak-top wavelengths (nm) and standard deviations of the three peaks (blue, green, and red) from the spectral data of emission from the organic EL cell; creating three data columns, i.e., b, g, and r, of a normal distribution function (Gaussian function) from these six numerical values (parameters); and adjusting the six parameters of the normal distribution function to minimize the sum of the squares of the difference between the sum of the data columns, i.e., b+g+r, and the measured emission spectrum by using the solver function provided as an add-in tool for Microsoft spreadsheet software (Excel) to perform curve fitting. The spectral data are preferably read at 401 points or more at equally spaced wavelengths in the range of 360 to 760 nm (at intervals of 1 nm or less).

The normal distribution peaks of blue, green, and red colors calculated by curve fitting are referred to below as the "blue peak," "green peak," and "red peak."

The lower limit of the blue peak-top wavelength ($\lambda B$) is preferably 400 nm, more preferably 420 nm, and even more preferably 440 nm. The upper limit of the blue peak-top wavelength ($\lambda B$) is preferably 495 nm, more preferably 485 nm, and even more preferably 480 nm.

The lower limit of the green peak-top wavelength ($\lambda G$) is preferably more than 495 nm, more preferably 500 nm or more, and even more preferably 510 nm or more. The upper limit of the green peak-top wavelength ($\lambda G$) is preferably 580 nm, more preferably 570 nm, and even more preferably 560 nm.

The lower limit of the red peak-top wavelength ($\lambda R$) is preferably more than 580 nm, and more preferably 590 nm or more.

The upper limit of the red peak-top wavelength ($\lambda R$) is preferably 680 nm, more preferably 660 nm, and even more preferably 650 nm.

Excellent color reproducibility can be ensured by using the circular polarizer of the present invention in the image display wherein the peak-top wavelength of each color is within the above range.

The lower limit of the standard deviation of the blue peak ($\alpha B$) is preferably 11 nm, more preferably 12 nm, even more preferably 13 nm, and especially preferably 14 nm. The upper limit of the standard deviation of the blue peak ($\alpha B$) is preferably 30 nm, more preferably 25 nm, and even more preferably 20 nm.

The lower limit of the standard deviation of the green peak ($\alpha G$) is preferably 15 nm, more preferably 18 nm, and even more preferably 20 nm. The upper limit of the standard deviation of the green peak ($\alpha G$) is preferably 45 nm, more preferably 35 nm, and even more preferably 30 nm.

The lower limit of the standard deviation of the red peak ($\alpha R$) is preferably 20 nm, more preferably 25 nm, and even more preferably 30 nm. The upper limit of the standard deviation of the red peak ($\alpha R$) is preferably 60 nm, more preferably 50 nm, and even more preferably 47 nm.

Setting the standard deviation of the peak of each color to a value higher than the lower limits described above can suppress color unevenness, whereas setting the standard deviation to a value lower than the upper limits described above can ensure high color reproducibility.

The lower limit of $\alpha B/\lambda B$ is preferably 0.024, more preferably 0.026, even more preferably 0.028, and particularly preferably 0.030. The upper limit of $\alpha B/\lambda B$ is preferably 0.065, more preferably 0.055, and even more preferably 0.045.

The lower limit of $\alpha G/\lambda G$ is preferably 0.027, more preferably 0.033, and even more preferably 0.036. The upper limit of $\alpha G/\lambda G$ is preferably 0.083, more preferably 0.064, and even more preferably 0.055.

The lower limit of $\alpha R/\lambda R$ is preferably 0.033, more preferably 0.042, and even more preferably 0.05. The upper limit of $\alpha R/\lambda R$ is preferably 0.1, more preferably 0.083, and even more preferably 0.078.

Setting the light source and the in-plane retardation of the substrate film to specific ranges is preferable for reduction of color unevenness and for color reproducibility.

The lower limit of $\alpha B/\lambda B \times Re$ is preferably 50 nm, more preferably 70 nm, even more preferably 90 nm, and particularly preferably 100 nm. The upper limit of $\alpha B/\lambda B \times Re$ is preferably 1000 nm, more preferably 500 nm, even more preferably 350 nm, and particularly preferably 300 nm.

The lower limit of $\alpha G/\lambda G \times Re$ is preferably 70 nm, more preferably 80 nm, even more preferably 100 nm, particularly preferably 120 nm, and most preferably 150 nm. The upper limit of $\alpha G/\lambda G \times Re$ is preferably 1200 nm, more preferably 600 nm, even more preferably 400 nm, and particularly preferably 350 nm.

The lower limit of $\alpha R/\lambda R \times Re$ is preferably 100 nm, more preferably 150 nm, even more preferably 200 nm, and particularly preferably 250 nm. The upper limit of $\alpha R/\lambda R \times Re$ is preferably 2000 nm, more preferably 1000 nm, even more preferably 700 nm, and particularly preferably 600 nm.

Setting $\alpha B/\lambda B$, $\alpha G/\lambda G$, $\alpha R/\lambda R$, $\alpha B/\lambda B \times Re$, $\alpha G/\lambda G \times Re$, and $\alpha R/\lambda R \times Re$ to values higher than the lower limits described above can suppress color unevenness, whereas setting $\alpha B/B$, $\alpha G/\lambda G$, $\alpha R/\lambda R$, $\alpha B/\lambda B \times Re$, $\alpha G/\Delta G \times Re$, and $\alpha R/\lambda R \times Re$ to values lower than the upper limits described above can ensure high color reproducibility.

The lower limit of the ratio of the intensity value at the green peak-top wavelength to the intensity value at the blue peak-top wavelength (G/B peak intensity ratio) is preferably 0.2, more preferably 0.25, and even more preferably 0.3. The upper limit of the G/B peak intensity ratio is preferably 0.7, more preferably 0.6, and even more preferably 0.5.

The lower limit of the ratio of the intensity value at the red peak-top wavelength to the intensity value at the blue peak-top wavelength (R/B peak intensity ratio) is preferably 0.17, and more preferably 0.2. The upper limit of the R/B peak intensity ratio is preferably 0.6, more preferably 0.5, and even more preferably 0.4.

By setting the peak intensity ratio to the above range, an image display device with excellent color reproducibility can be obtained. The intensity at the top wavelength of the peak for each color refers to the highest intensity value of each color.

The lower limit of the ratio of the green peak area intensity to the blue peak area intensity (G/B area intensity ratio) is preferably 0.3, more preferably 0.4, and even more preferably 0.45. The upper limit of the G/B area intensity ratio is preferably 1.0, more preferably 0.8, and even more preferably 0.7.

The lower limit of the ratio of the red peak area intensity to the blue peak area intensity (R/B area intensity ratio) is preferably 0.3, more preferably 0.4, and even more preferably 0.45. The upper limit of the R/B area intensity ratio is preferably 1.0, more preferably 0.8, and even more preferably 0.7.

By setting the area intensity ratio to the above range, an image display device with excellent color reproducibility can be obtained. The peak area intensity of each color can be determined as the sum of the intensity values of each color at wavelengths in the range of 360 to 760 nm.

EXAMPLES

The present invention is described below in more detail with reference to Examples. However, the present invention is not limited to the Examples below. The present invention can be put into practice after appropriate modifications or variations within a range that meets the gist of the present invention, all of which are included in the technical scope of the present invention.

The methods for evaluating physical properties in the Examples are as follows.

(1) Moisture Permeability

The moisture permeability was measured under the conditions of 25° C. and 90% RH in accordance with JIS Z 0208.

(2) Orientation Axis Direction and Refractive Index of Substrate film

The orientation axis direction of the substrate film was determined using a molecular orientation analyzer (MOA-6004 molecular orientation analyzer, produced by Oji Scientific Instruments). The substrate film was cut into a rectangle of 4 cm×2 cm such that the orientation axis direction was parallel to the longer side, and used as a measurement sample. For the sample, the refractive indices of the two axes that are orthogonal to each other (nx, ny) and the refractive index in the thickness direction (nz) were determined with an Abbe refractometer (NAR-4T, produced by Atago Co., Ltd., measurement wavelength: 589 nm). The measurement was made at 5 points in the width direction of the film (center, both ends, and midpoints between the center and each end), and the average was taken as the refractive index.

(3) Original Film Thickness (d)

The thickness was measured at 5 points with an electric micrometer (Millitron 1245D, produced by Feinpruf GmbH), and the average was obtained.

(4) In-Plane Retardation (Re)

The in-plane retardation (Re) was calculated by multiplying the difference between the refractive indices (ΔNxy) by the film thickness d (nm).

(5) Nz Coefficient

The value obtained by |ny−nz|/|ny−nx| was defined as Nz coefficient.

(6) Surface Orientation (ΔP) The value obtained by (nx+ny)/2−nz was defined as surface orientation (ΔP).

(7) Thickness Direction Retardation (Rth)

The thickness-direction retardation is a parameter indicating the average of retardation values obtained by multiplying each of two birefringence values ΔNxz (=|nx−nz|) and ΔNyz (=|ny−nz|) when viewed from a film-thickness direction cross-section by the film thickness d. The values of nx, ny, nz, and film thickness d (nm) were determined in the same manner as described above, and the average value of (ΔNxz×d) and (ΔNyz×d) was calculated to determine the thickness direction retardation (Rth).

$$Rth=(\Delta Nxz \times d + \Delta Nyz \times d)/2$$

(8) Roughness of Anti-Glare Surface (RSm, Ra, Rzjis, θa, Rku, RSk, RΔq)

Parameters of the anti-glare surface were determined from roughness curves obtained by measurement using a contact roughness meter (SJ-410, produced by Mitutoyo Corporation, detector: 178-396-2; stylus: standard stylus 122AC731 (2 μm)). The settings were as follows.

Curve: R
Filter: Gauss
λc: 0.8 mm
λs: 2.5 μm
Measurement length: 5 mm
Measurement speed: 0.5 mm/s
RSm, Ra, Rzjis, θa, Rku, RSk, and RΔq were obtained in accordance with JIS B0601-2001.

(9) Light Transmittance at Wavelength of 380 nm

Using a spectrophotometer (U-3500, produced by Hitachi, Ltd.), the light transmittance of each film at a wavelength of 300 to 500 nm was measured using an air layer as standard, and the light transmittance at a wavelength of 380 nm was determined.

(10) Reflection Reduction Layer Thickness

A substrate film comprising a reflection reduction layer was embedded into an epoxy resin, and the cross-section of the film-embedded resin was sectioned and observed with a transmission electron microscope.

(11) Reflectance 5-degree reflectance at a wavelength of 550 nm was measured from the surface of the reflection reduction layer (anti-reflective layer side (or low-reflective layer side)) using a spectrophotometer (UV-3150, produced by Shimadzu Corporation). The measurement was made after a black felt-tip marker was applied to one side of the polyester film that was opposite to the side having a reflection reduction layer (an anti-reflective layer (or a low-reflective layer) and black vinyl tape (HF-737, produced by Kyowa Limited, width: 50 mm) was then applied to the surface.

Production of Easy-to-Adhere Layer Components
Polymerization of Polyester Resin 194.2 parts by mass of dimethyl terephthalate, 184.5 parts by mass of dimethyl isophthalate, 14.8 parts by mass of dimethyl-5-sodium sulfoisophthalate, 233.5 parts by mass of diethylene glycol, 136.6 parts by mass of ethylene glycol, and 0.2 parts by mass of tetra-n-butyl titanate were placed in a stainless-steel autoclave equipped with a stirrer, a thermometer, and a partial reflux condenser. A transesterification reaction was performed at a temperature of 160 to 220° C. for 4 hours. Subsequently, after the temperature was raised to 255° C. and the pressure of the reaction system was gradually reduced, a reaction was allowed to proceed at a reduced pressure of 30 Pa for an hour and a half, thus obtaining a copolyester resin. The obtained copolyester resin was transparent light yellow. The reduced viscosity of the copolyester resin was measured as being 0.70 dl/g. The glass transition temperature as measured by DSC was 40° C.

Preparation of Aqueous Polyester Dispersion 30 parts by mass of the copolyester resin and 15 parts by mass of ethylene glycol n-butyl ether were placed in a reactor equipped with a stirrer, a thermometer, and a reflux condenser. The resulting mixture was heated at 110° C. and stirred to dissolve the resin. After the resin was completely dissolved, 55 parts by mass of water were gradually added to the polyester solution while stirring. After the addition, the resulting liquid was cooled to room temperature while stirring, thus producing a milky-white aqueous polyester dispersion with a solids content of 30 mass %.

Polymerization of Blocked Polyisocyanate Crosslinking Agent Used in the Easy-to-Adhere Layer 100 parts by mass of a polyisocyanate compound comprising hexamethylene diisocyanate as a starting material and having an isocyanurate structure (Duranate TPA, produced by Asahi Kasei Corporation), 55 parts by mass of propylene glycol monomethyl ether acetate, and 30 parts by mass of polyethylene glycol monomethyl ether (average molecular weight: 750) were placed in a flask equipped with a stirrer, a thermometer, and a reflux condenser tube, and maintained in a nitrogen atmosphere at 70° C. for 4 hours. The temperature of the reaction mixture was then reduced to 50° C., and 47 parts by mass of methylethylketoxime was added dropwise. The infrared spectrum of the reaction mixture was measured, and disappearance of the isocyanate group absorption was confirmed. A blocked polyisocyanate aqueous dispersion having a solids content of 75 mass % was thus obtained.

Preparation of Coating Liquid for Easy-to-adhere Layer

The following coating components were mixed to prepare coating liquid P1.

| | |
|---|---|
| Water | 50.00 mass % |
| Isopropanol | 33.00 mass % |
| Polyester aqueous dispersion | 12.00 mass % |
| Blocked isocyanate crosslinking agent | 0.80 mass % |
| Particles (silica sol with a mean particle size of 100 nml, solids content: 40 mass %) | 1.40 mass % |
| Catalyst (organic tin compound solids content: 14 mass %) | 0.30 mass % |
| Surfactant (silicon-based solids content: 10 mass %) | 0.50 mass % |

Production of Polyester Resin for Substrate films

Production Example 1—Polyester X

The temperature of an esterification reaction vessel was increased. When the temperature had reached 200° C., 86.4 parts by mass of terephthalic acid and 64.6 parts by mass of ethylene glycol were placed in the vessel. While stirring the mixture, 0.017 parts by mass of antimony trioxide, 0.064 parts by mass of magnesium acetate tetrahydrate, and 0.16 parts by mass of triethylamine were added as catalysts. Subsequently, the pressure and temperature were increased, and a pressure esterification reaction was performed at a gauge pressure of 0.34 MPa at 240° C. The pressure in the esterification reaction vessel was then returned to normal pressure, and 0.014 parts by mass of phosphoric acid were added. Further, the temperature was increased to 260° C. over a period of 15 minutes, and 0.012 parts by mass of trimethyl phosphate was added. Subsequently, after 15 minutes, dispersion was performed with a high-pressure disperser. After 15 minutes, the obtained esterification reaction product was transferred to a polycondensation reaction vessel, and a polycondensation reaction was performed at 280° C. under reduced pressure.

After completion of the polycondensation reaction, the polycondensate was filtered using a Naslon filter (95% cut size: 5 μm). The filtrate was extruded through a nozzle into a strand shape, cooled with cooling water that was filtered beforehand (pore size: 1 μm or less), solidified, and cut into pellets. The obtained polyethylene terephthalate resin (X) had an intrinsic viscosity of 0.62 dl/g and substantially contained no inert particles or internally deposited particles (abbreviated below as "PET (X)").

Production Example 2—Polyester Y 10 parts by mass of a dried UV absorber (2,2'-(1,4-phenylene)bis(4H-3,1-benzoxazin-4-one) and 90 parts by mass of particle-free PET (X) (intrinsic viscosity: 0.62 dl/g) were mixed. A kneading extruder was used to obtain a polyethylene terephthalate resin (Y) containing the UV absorber (abbreviated below as "PET (Y)").

Production of Substrate Film 1

As starting materials for a substrate film intermediate layer, 90 parts by mass of particle-free PET (X) resin pellets and 10 parts by mass of UV absorber-containing PET (Y) resin pellets were vacuum-dried (1 Torr) at 135° C. for 6 hours, and then supplied to extruder 2 (for intermediate layer II) and melted at 285° C. On the other hand, PET (X) was dried by a standard method, then supplied to extruder 1 (for outer layer I and outer layer III) and melted at 285° C. These two types of polymers were each filtered through a filtering medium of a stainless-steel sintered body (nominal filtering accuracy: 10 μm particle 95% cut), laminated using a two-type three-layer junction block, and extruded through a die into a sheet-like shape. The resulting sheet was cooled and solidified by winding the sheet around a casting drum with a surface temperature of 30° C. by an electrostatic casting method, thereby forming an unstretched film. The amounts discharged from the extruders in this lamination were adjusted to achieve a thickness ratio of layer I/layer II/layer III of 10:80:10.

Subsequently, after the coating liquid for easy-to-adhere layer was applied to both sides of the unstretched PET film by reverse-roll coating so that the amount of the coating liquid applied to each side was 0.08 g/m² on a dry weight basis, the resulting film was guided to a dryer and dried at 80° C. for 20 seconds.

The unstretched film on which the coating layer was formed was guided to a tenter stretching machine. With the end portions of the film held with clips, the film was guided to a hot-air zone with a temperature of 125° C., and stretched 4 times in the width direction.

Subsequently, while the width of the film stretched in the width direction was maintained, the film was heat-treated at a temperature of 225° C. for 10 seconds, and further subjected to 3.0% relaxation. The film was then cooled to 130° C., and both end portions of the film were cut with a shear blade. After the selvages of the film were cut off under a tension of 0.5 kg/mm², the film was rolled up to obtain a uniaxially oriented PET film with a film thickness of 80 μm.

The center of the obtained film was slit to a width of 150 cm to make a film roll of about 300 m in length. The slow axis direction of the obtained film ranged from 89.5 to 90.5 degrees with respect to the longitudinal direction of the film, and the average was 90 degrees (the angle being defined as positive (+) for clockwise rotation with respect to the longitudinal direction).

Substrate Film 2

A film with a different film thickness (substrate film 2) was obtained in the same manner as in the production of substrate film 1 except that the line speed was changed to change the thickness of the unstretched film. The slow axis direction was the same as that of substrate film 1.

Substrate Film 3

An unstretched film produced in the same manner as in the product of substrate film 1 in Example 1 (on which an easy-to-adhere layer was formed by coating) was heated to 105° C. using heated rolls and an infrared heater. The film was then stretched 3.5 times in the running direction by rolls having different peripheral speeds, and then guided to a hot-air zone with a temperature of 135° C., and stretched 3.5 times in the width direction. The film was subjected to the subsequent treatments in the same manner as the production of substrate film 1, thus obtaining substrate film 3. However, the amount of coating discharged from the extruder was adjusted so that the resulting film had a thickness of 80 μm. The direction of the slow axis direction of the obtained film was 87 to 93 degrees relative to the longitudinal direction of the film, and the average was 90 degrees.

Substrate Film 4

A film with a different film thickness (substrate film 4) was obtained in the same manner as in the production of substrate film 3 except that the line speed was changed to change the thickness of the unstretched film. The slow axis direction was the same as that of substrate film 3.

Substrate Film 5

The end portion in the width direction of a roll immediately after production of substrate film 4 was slit to thereby obtain substrate film 5. The direction of the slow axis direction of the obtained film was in the range of 26 to 40 degrees relative to the width direction of the film, and the direction was 32 degrees on average.

Substrate Film 6

A polymer chip containing crosslinked polystyrene particles with an average particle size of 2 μm as a lubricant in an amount of 2.0 wt. % relative to syndiotactic polystyrene (weight average molecular weight: 300,000) and a lubricant-free polymer chip were mixed at a weight ratio of 1:9 and then dried. The resulting mixture was fed to extruder 1 and melted at 295° C., whereas dried syndiotactic polystyrene alone was fed to extruder 2 and melted at 295° C., and unstretched sheets were obtained in the same manner as in the production of substrate film 1.

After the easy-to-adhere coating liquid was applied to both sides of the unstretched sheet and dried, the film was guided to a tenter stretching machine. With the end portions of the film held with clips, the film was guided to a hot-air zone with a temperature of 120° C. and stretched 3.5 times in the width direction.

Subsequently, while the width of the film stretched in the width direction was maintained, the film was treated at a temperature of 265° C. for 10 seconds, and further subjected to 3.0% relaxation at 230° C.

Substrate Film 7

PMMA resin (Delpet 80N, produced by Asahi Kasei Chemicals Co., Ltd.) was dried in a vacuum dryer at 90° C., then fed into a uniaxial kneading extruder, and kneaded and extruded at 235° C. The molten resin was filtered through a filtering medium of a stainless-steel sintered body (nominal filtering accuracy: 10-μm particle 95% cut) and extruded into a sheet shape from a mouthpiece. The extruded resin was wound around a casting drum with a surface temperature of 103° C. and a touch roll at 99° C. was brought into contact with the resin sheet from the back. The resin sheet was then peeled off from the casting drum and cooled in a cooling drum to thereby form an acrylic film with a thickness of 50 μm.

Substrate Film 8

A TAC film with a thickness of 60 μm was used.

Table 1 shows properties of the substrate films.

TABLE 1

|  | Substrate film 1 | Substrate film 2 | Substrate film 3 | Substrate film 4 | Substrate film 5 | Substrate film 6 | Substrate film 7 | Substrate film 8 |
|---|---|---|---|---|---|---|---|---|
| Resin | PET | PET | PET | PET | PET | SPS | PMMA | TAC |
| Thickness (μm) | 80 | 60 | 80 | 50 | 50 | 60 | 50 | 60 |
| Re (nm) | 8160 | 6180 | 3840 | 2400 | 2450 | 5160 | ~0 | ~0 |
| Re/Rth | 0.887 | 0.892 | 0.293 | 0.287 | 0.298 | 0.905 | — | — |
| Nz coefficient | 1.63 | 1.62 | 3.92 | 3.98 | 3.86 | 1.60 | — | — |
| ΔP | 0.115 | 0.116 | 0.164 | 0.167 | 0.165 | 0.095 | — | — |
| Moisture permeability (g/m² · day) | 7 | 9 | 7 | 11 | 11 | 74 | 55 | 300 |
| 380-nm light transmittance (%) | 1 | 1 | 1 | 1.5 | 1.5 | 78 | 90 | 1 |

Production of Polarizing Element

An unstretched film with a thickness of 100 μm was prepared using polyester X as a thermoplastic resin base material. An aqueous solution of polyvinyl alcohol with a degree of polymerization of 2400 and a degree of saponification of 99.9 mole % was applied to one side of the unstretched film and dried to form a PVA layer.

The obtained laminate was stretched two-fold in the longitudinal direction between rolls at different circumferential speeds at 120° C. and wound up. Next, the resulting laminate was treated with a 4% aqueous boric acid solution for 30 seconds, then immersed in a mixed aqueous solution of iodine (0.2%) and potassium iodide (1%) for 60 seconds for dying, and subsequently treated with a mixed aqueous solution of potassium iodide (3%) and boric acid (3%) for 30 seconds.

The above laminate was further uniaxially stretched in the longitudinal direction in a mixed aqueous solution of boric acid (4%) and potassium iodide (5%) at 72° C. Subsequently, the laminate was washed with a 4% potassium iodide solution and the aqueous solution was removed using an air knife. The laminate was then dried in an oven at 80° C. Both end portions of the laminate were slit and the laminate was wound up to obtain a polarizing element laminated on a polyester substrate having a width of 80 cm and a length of 1000 m. The total draw ratio was 6.5, and the thickness of the polarizing element was 5 μm. The thickness was measured by embedding the polarizing element laminated on the polyester substrate into an epoxy resin and cutting its cross-section to form a section, and observing the section under an optical microscope to read the thickness.

Production of λ/4 Phase-difference Layer Transfer Film

A coating composition for rubbing orientation control layers was applied to a non-adhesive coat surface of a biaxially oriented polyester film (Cosmoshine® A4100, produced by Toyobo Co., Ltd.) with a width of 150 cm and a thickness of 50 μm using a bar coater. The coated film was guided to an oven at 120° C. and dried to form a film with a thickness of 200 nm. Subsequently, the surface of the obtained film was treated with a rubbing roll around which a nylon raised cloth was wrapped, thus obtaining an oriented film for transfer comprising a rubbing orientation control layer. The rubbing was performed in parallel to the flow direction of the film.

Coating Composition for Rubbing Orientation Control Layer

Fully Saponified Polyvinyl Alcohol
  (weight average molecular weight: 800): 2 parts by mass
  Ion exchange water: 100 parts by mass
  Surfactant: 0.5 parts by mass
  Subsequently, a solution for forming a phase-difference layer of the following composition (an oriented liquid-crystal compound layer) was applied to the rubbed surface by using a bar coater, guided to an oven at 110° C. and dried, and then cured by irradiation with UV light to form a λ/4 phase-difference layer transfer film.

Solution for Phase-Difference Layer Formation

Rod-Shaped Liquid-Crystal Compound
  (LC242, produced by BASF): 75 parts by mass
  Compound of the following compound: 20 parts by mass

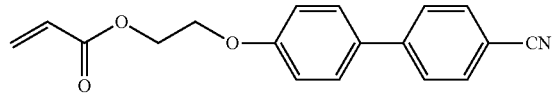 [SMILES: C=CC(=O)OCCOc1ccc(-c2ccc(C#N)cc2)cc1]

Trimethylolpropane triacrylate: 5 parts by mass
Irgacure 379: 3 parts by mass
Surfactant: 0.1 parts by mass
Methyl ethyl ketone: 250 parts by mass The phase-difference layer of the λ/4 phase-difference layer transfer film was transferred to two glass plates by using a commercially available optical adhesive sheet. The two glass plates, on each of which was laminated the λ/4 phase-difference layer, were laminated on each other and disposed between parallel Nicol polarizers, and the observation was made under irradiation with light from the back. Almost no light was observed, and the obtained product was thus confirmed to be a λ/4 phase-difference layer.

The following compositions were prepared as a low-refractive-index layer composition, a high-refractive-index layer composition, and a low-refractive-index anti-glare layer composition.

Composition for Low-Refractive-Index Layers
  Pelltron (trademark) A-2508LR (produced by Pelnox Limited, containing hollow silica, refractive index: 1.33 (Abbe))
Composition for High-Refractive-Index Layers
  Pelltron (trademark) A-2300 (produced by Pelnox Limited, refractive index: 1.65 (Abbe))
Composition for Low-Refractive-Index Anti-Glare Layers
Crosslinked Acrylic Particles
  (average particle diameter: 1.5 μm)
  (MX-150, produced by Soken Chemical and Engineering Co., Ltd.): 3.5 g
Crosslinked Acrylic Particles
  (average particle diameter: 3.0 μm)
  (MX-300, produced by Soken Chemical and Engineering Co., Ltd.) 1.5 g
Low-Refractive-Index Curable Resin
  (refractive index after curing: 1.35)
  Peltron® A-2502LR, produced by
  Pernox Limited 900 g
  As a photoinitiator, Irgacure 184 was added in an amount of 3 mass % (on a solids basis) to these compositions.

Example 1

The composition for high-refractive-index layers was applied to one side of substrate film 1. The coated film was then dried in an oven at 80° C. for 1 minute to evaporate the solvent, and irradiated with ultraviolet rays to form a high-refractive-index layer (thickness: 130 nm). Further, the composition for low-refractive-index layers was applied to the high-refractive-index layer to form a low-refractive-index layer (thickness: 86 nm) in the same manner as described above, thus obtaining substrate film 1 on which an anti-reflective layer was laminated.

Subsequently, a UV-curable adhesive was applied to a surface of substrate film 1 that was on the side opposite to the side on which the anti-reflective layer was laminated. The thus coated substrate film 1 was laminated on the surface of a polarizing element laminated on the polyester substrate. For the lamination, substrate film 1 and the polarizing element laminated on the polyester substrate were cut into sheets and laminated on each other in such a manner that the angle between the longitudinal direction of substrate film 1 and the longitudinal direction of the polarizing element was 45 degrees (the angle between the slow axis of substrate film 1 and the extinction axis of the polarizing element was 45 degrees). Subsequently, after ultraviolet rays were irradiated from the polyester substrate side to cure the adhesive, the polyester substrate of the polarizing element was peeled off to obtain a laminate of the anti-reflective layer, substrate film 1, and the polarizing element (80 cm×130 cm).

Further, a UV-curable adhesive was applied to the polarizing element surface of the laminate, and the coated laminate and the phase-difference layer surface of the λ/4 phase-difference layer transfer film cut out into a sheet were bonded together. The polyester film (A4100) of the λ/4 phase-difference layer transfer film was peeled off and the end portions were cut to obtain a circular polarizer of 70 cm×122 cm. As the λ/4 phase-difference layer transfer film, a film cut into a size of 80 cm×130 cm so that the rubbing direction was 45 degrees relative to the longer side was used. The angle between the extinction axis of the polarizing element and the orientation direction (rubbing direction) of the λ/4 phase difference layer was 45 degrees.

Example 2

A UV-curable adhesive was applied to a surface of substrate film 1 used in Example 1 on the side opposite to the side of substrate film 1 on which the anti-reflective layer was laminated. The obtained film and the phase-difference layer surface of a λ/4 phase-difference layer transfer film were bonded together. The polyester film (A4100) of the λ/4 phase-difference layer transfer film was peeled off to obtain a laminate of the anti-reflective layer, substrate film 1, and the λ/4 phase-difference layer.

Subsequently, the polarizing element and the λ/4 phase-difference layer were laminated in the same manner as in Example 1 to obtain a circular polarizer. However, assuming that substrate film 1 and the polarizing element would be bonded together by roll-to-roll lamination, the longitudinal direction of substrate film 1 and the longitudinal direction of the polarizing element were arranged to be parallel to each other (the angle between the slow axis of substrate film 1 and the extinction axis of the polarizing element being 90 degrees). The angle between the extinction axis of the polarizing element and the orientation direction (rubbing direction) of each of the λ/4 phase-difference layers that were laminated on both sides of the polarizing element was 45 degrees.

Example 3

A circular polarizer was obtained in the same manner as in Example 1 except that substrate film 2 was used.

Example 4

A circular polarizer was obtained in the same manner as in Example 1 except that substrate film 3 was used.

Example 5

A circular polarizer was obtained in the same manner as in Example 2 except that substrate film 5 was used, and no λ/4 phase-difference layer was disposed between substrate film 5 and the polarizing element.

Example 6

A circular polarizer was obtained in the same manner as in Example 1 except that substrate film 6 was used.

Example 7

A circular polarizer was obtained in the same manner as in Example 1 except that substrate film 4 was used.

Example 8

A circular polarizer was obtained in the same manner as in Example 2 except that substrate film 7 was used.

Example 9

The composition for low-refractive-index anti-glare layers was applied to one side of substrate film 1. The coated film was then dried in an oven at 80° C. for 1 minute to evaporate the solvent, and irradiated with UV rays to obtain substrate film 1 on which a 4-μm-thick low-reflective-index anti-glare layer was laminated. The rest of the process was performed in the same manner as in Example 1 to obtain a circular polarizer.

The surface roughness of the low-reflective-index anti-glare layer was as follows.

| | |
|---|---|
| RSm | 260 μm |
| Ra | 0.109 μm |
| Rzjis | 0.064 μm |
| Θa | 0.25 degrees |
| Rku | 2.9 |
| RSk | 0.27 |
| RΔq | 0.0032 |

Comparative Example 1

A circular polarizer was obtained in the same manner as in Example 2 except that substrate film 8 was used.

Comparative Example 2

A circular polarizer was obtained in the same manner as in Example 7 except that no reflection reduction layer was formed.

Evaluation of Organic EL Display Devices

Circular polarizers of organic EL display devices were removed. Circular polarizers obtained in the Examples and Comparative Examples were placed instead, and the condition of the obtained image was observed.

The following organic EL display devices were used.
A: OLED 55B8PJA, produced by LG Electronics, model with blue organic EL light emitter and phosphor
B: iPhone X, produced by Apple Inc., model with red, green, and blue LEDs Curve Fitting Method The emission spectrum of the organic EL light source (the spectrum emitted from the organic EL cell) was measured with an MK350 produced by UPRtek. The peak-top wavelengths (nm) and standard deviations of the three peaks (blue, green, and red) were read from the obtained data. From these six numerical values (parameters), three data columns, i.e., b, g, and r, of a normal distribution function (Gaussian function) were created. Subsequently, the sum of the three data columns, i.e., b+g+r, was calculated. Six parameters of the normal distribution function were adjusted to minimize the sum of squares of the difference between this sum spectrum (the calculated initial spectrum) and the measured excitation spectrum to perform curve fitting. For convergence of the numerical values, the measured spectral data were input into Microsoft Excel spreadsheet software and the solver function was used. The spectral data were preferably read at 401 points at equally spaced wavelengths in the range of 360 to 760 nm.

Figure 2:
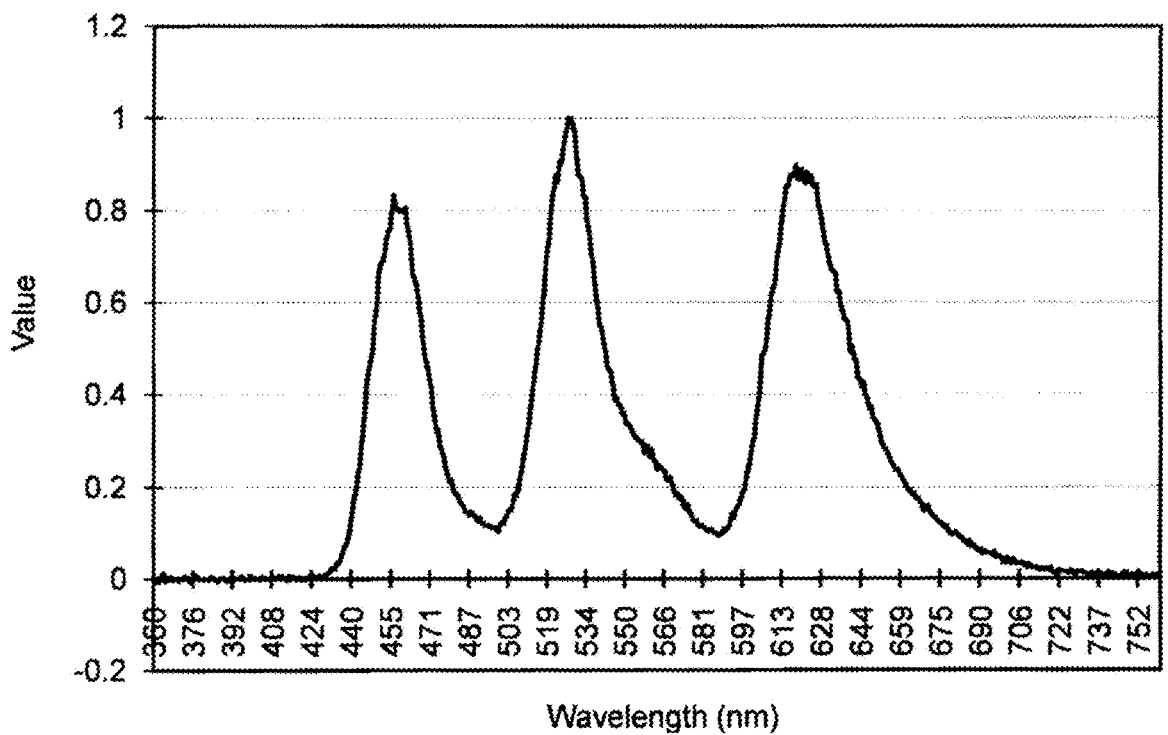
FIG. 2 shows an emission spectrum of organic EL display device B used in the Examples but with the circular polarizer removed from organic EL display device B.

FIG. 1 shows the emission spectrum of organic EL display device A with its circular polarizer removed. FIG. 2 shows the emission spectrum of organic EL display device B with its circular polarizer removed.

Figure 3:
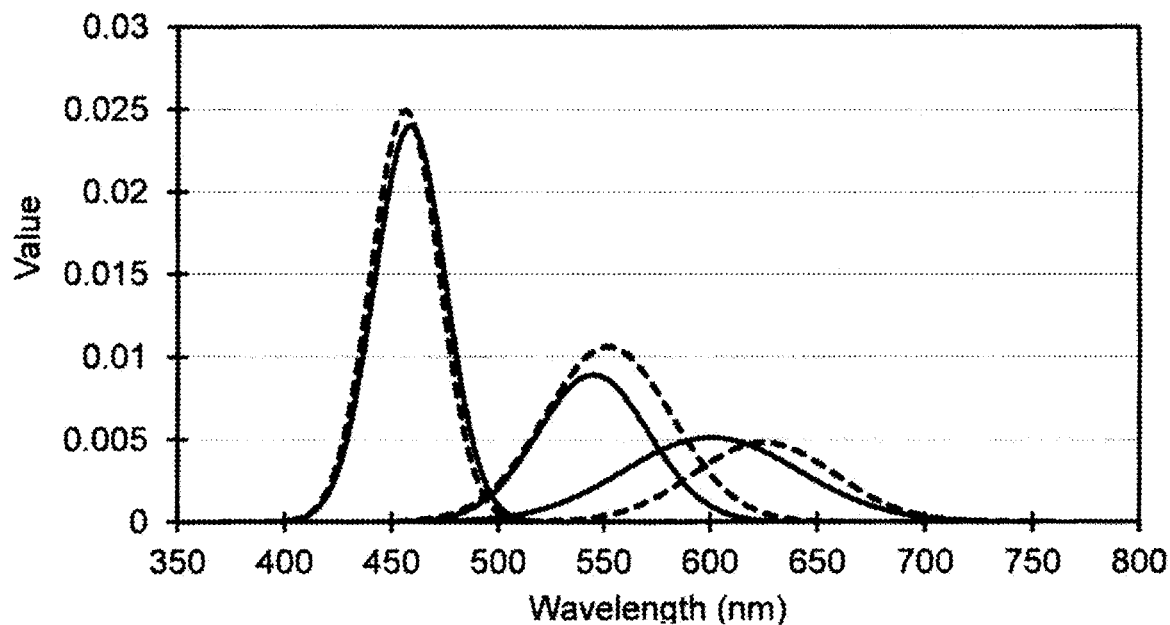
FIG. 3 is a graph showing the results of curve fitting to the emission spectrum of organic EL display device A.

FIG. 3 is a graph showing the results of curve fitting to the emission spectrum of organic EL display device A. In FIG. 3, the dotted lines indicate blue, green, and red peaks before curve fitting; and the solid lines indicate blue, green, and red peaks after curve fitting.

Figure 4:
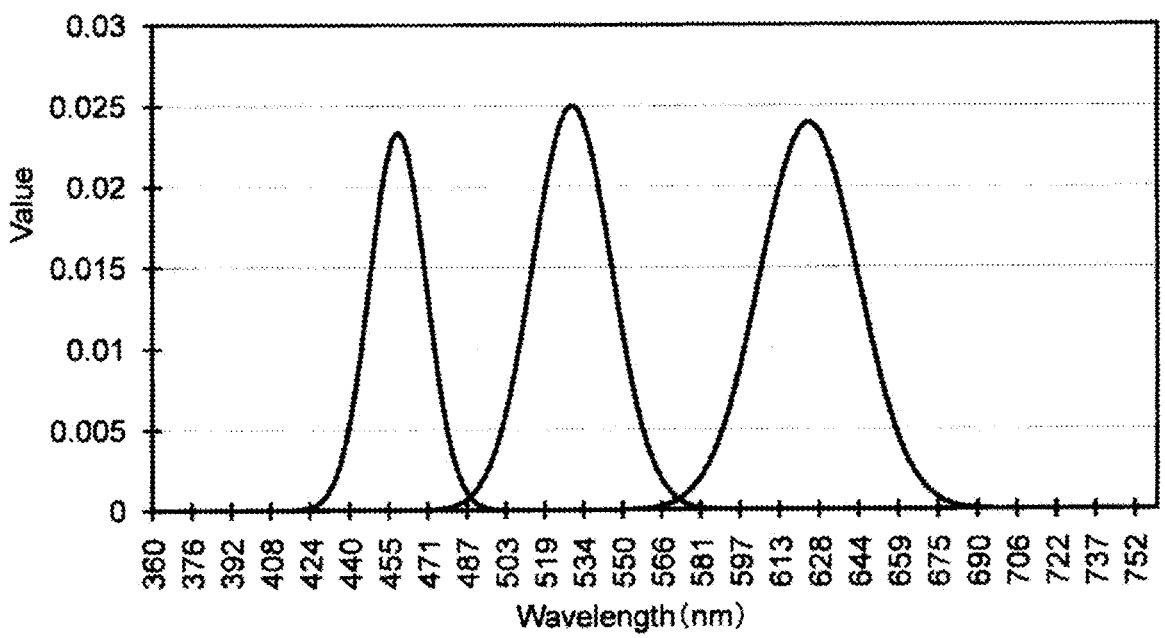
FIG. 4 is a graph showing the results of curve fitting to the emission spectrum of organic EL display device B (after curve fitting).

FIG. 4 is a graph showing the results of curve fitting to the emission spectrum of organic EL display B (after curve fitting).

Further, Table 2 shows the data and parameters for curve fitting of the emission spectra of organic EL display devices A and B.

TABLE 2

| | | Organic EL display device | |
|---|---|---|---|
| | | A | B |
| Before curve fitting | Blue peak-top wavelength ($\lambda$B) | 456 nm | 460 nm |
| | Green peak-top wavelength ($\lambda$G) | 552 nm | 528 nm |
| | Red peak-top wavelength ($\lambda$R) | 625 nm | 620 nm |
| | Blue standard deviation ($\alpha$B) | 16 nm | 13.2 nm |
| | Green standard deviation ($\alpha$G) | 30 nm | 13.6 nm |
| | Red standard deviation ($\alpha$R) | 33 nm | 19.3 nm |
| | Intensity at the top wavelength of the blue peak | 1 | 1 |
| | Intensity at the top wavelength of the green peak | 0.8 | 1.25 |
| | Intensity at the top wavelength of the red peak | 0.4 | 1.12 |
| After curve fitting | Blue peak-top wavelength ($\lambda$B) | 458 nm | 459 nm |
| | Green peak-top wavelength ($\lambda$G) | 545 nm | 529 nm |
| | Red peak-top wavelength ($\lambda$R) | 600 nm | 624 nm |
| | Blue standard deviation ($\alpha$B) | 16.6 nm | 11.3 nm |
| | Green standard deviation ($\alpha$G) | 23.3 nm | 15.9 nm |
| | Red standard deviation ($\alpha$R) | 41.1 nm | 19.3 nm |
| | $\alpha$B/$\lambda$B | 0.036 | 0.025 |
| | $\alpha$G/$\lambda$G | 0.043 | 0.030 |
| | $\alpha$R/$\lambda$R | 0.069 | 0.031 |
| | G/B peak intensity ratio | 0.372 | 1.071 |
| | R/B peak intensity ratio | 0.214 | 1.027 |
| | G/B area intensity ratio | 0.590 | 1.507 |
| | R/B area intensity ratio | 0.530 | 1.753 |

The obtained images of the display devices were evaluated as follows. Table 3 shows the results.

Iridescent Color Unevenness (Rainbow Unevenness)

White was displayed on the entire screen of the obtained display devices, and the degree to which iridescent color unevenness occurred was visually observed from a diagonal direction. Organic EL display devices A and B were individually evaluated.
A: No iridescent color unevenness was observed when viewed from a diagonal direction.
B: When the angle was changed, slight flicker due to iridescent color unevenness was observed.
C: Slight iridescent color unevenness was were observed.
D: Iridescent color unevenness was observed.

Color Reproducibility

A landscape photograph was displayed on the obtained display devices, and the color tone was visually observed at angles changed from the front to a diagonal direction. Evaluation was made by comparison with the color tone in the state before the circular polarizer was replaced (i.e., with the circular polarizer removed from organic EL display devices A and B). Organic EL display devices A and B were individually evaluated.
A: Reflected light was suppressed and a vivid image was obtained; and no change in color tone was perceived.
B: Reflected light was suppressed and a vivid image was obtained; however, a slight change in color tone was perceived in a few directions.
C: Reflected light was suppressed and a vivid image was obtained; however, the color tone changed in a few directions.

D: Reflected light was not sufficiently suppressed, or the color tone partially changed.

Blackout

A landscape image was displayed on the obtained display device and observed with polarized sunglasses. The polarizing element and polarized sunglasses were disposed in a cross-Nicol arrangement, and changes in brightness and color tone were observed with the observer's head tilted. Only organic EL display device A was evaluated.
- A: Even when the observer's head was tilted, neither brightness nor color tone changed.
- B: When the observer's head was tilted, lightness was reduced.
- C: When the observer's head was tilted, color tone changed.
- D: The image was blacked out with the observer's head straightforward.

Evaluation in High Humidity

The organic EL panel was removed from organic EL display device A. The circular polarizer placed thereon was bonded to the organic EL panel by using an optical transparent adhesive sheet.

Panel Defamation in High-humidity Storage

The obtained panel was left in an environment of 40° C. and 95% RH for 24 hours, and the state of deformation of the panel was then observed.
- A: No defamation of the panel was observed.
- B: Slight warpage of the panel was observed.
- C: Warpage of the panel was observed but was within an acceptable range.
- D: The observed warpage of the panel was so severe that the panel was unlikely to fit into the housing.

Anti-Reflection Performance after High-Humidity Storage

Further, using panels that were left in a dark environment at 40° C. and 95% RH for 1 month, display devices were assembled. A landscape image was displayed on the display devices in a bright room to observe the state of contrast reduction due to a decrease of anti-reflection functionality.
- A: No contrast reduction was observed.
- B: Slight contrast reduction was observed at the periphery.
- C: Contrast reduction was observed at the periphery.
- D: Overall contrast reduction was observed.

TABLE 3

|  | Example 1 | Example 2 | Example 3 | Example 4 | Example 5 | Example 6 | Example 7 | Example 8 | Example 9 | Comp. Example 1 | Comp. Example 2 |
|---|---|---|---|---|---|---|---|---|---|---|---|
| Laminate structure | AR Substrate film 1 Polarizing element λ/4 phase-difference layer | AR Substrate film 1 λ/4 phase-difference layer Polarizing element λ/4 phase-difference layer | AR Substrate film 2 Polarizing element λ/4 phase-difference layer | AR Substrate film 3 Polarizing element λ/4 phase-difference layer | AR Substrate film 5 Polarizing element λ/4 phase-difference layer | AR Substrate film 6 Polarizing element λ/4 phase-difference layer | AR Substrate film 4 Polarizing element λ/4 phase-difference layer | AR Substrate film 7 λ/4 phase-difference layer Polarizing element λ/4 phase-difference layer | AG-LR Substrate film 1 Polarizing element λ/4 phase-difference layer | AR Substrate film 8 λ/4 phase-difference layer Polarizing element λ/4 phase-difference layer | Substrate film 4 Polarizing element λ/4 phase-difference layer |
| Reflectance (%) | 1 | 1 | 1 | 1 | 1 | 1 | 1 | 1 | 2 | 1 | 6 |
| Angle between the slow axis of substrate film and extinction axis of the polarizing element | 45° | 90° | 45° | 45° | 58° | 45° | 45° | — | 45° | — | 45° |
| $\alpha B/\lambda B \times Re$ (organic EL display device A) | 296 | 296 | 224 | 139 | 89 | 187 | 87 | — | 296 | — | 87 |
| $\alpha G/\lambda G \times Re$ (organic EL display device A) | 349 | 349 | 264 | 164 | 105 | 221 | 103 | — | 349 | — | 103 |
| $\alpha R/\lambda R \times Re$ (organic EL display device A) | 559 | 559 | 423 | 263 | 168 | 353 | 164 | — | 559 | — | 164 |
| $\alpha B/\lambda B \times Re$ (organic EL display device B) | 201 | 201 | 152 | 95 | 60 | 127 | 59 | — | 201 | — | 59 |
| $\alpha G/\lambda G \times Re$ (organic EL display device B) | 245 | 245 | 186 | 115 | 74 | 155 | 72 | — | 245 | — | 72 |
| $\alpha R/\lambda R \times Re$ (organic EL display device B) | 252 | 252 | 191 | 119 | 76 | 160 | 74 | — | 252 | — | 74 |

TABLE 3-continued

| | Example 1 | Example 2 | Example 3 | Example 4 | Example 5 | Example 6 | Example 7 | Example 8 | Example 9 | Comp. Example 1 | Comp. Example 2 |
|---|---|---|---|---|---|---|---|---|---|---|---|
| Iridescent color unevenness observed on organic EL display device A | A | A | A | B | B | A | B | A | A | A | C to D |
| Color reproducibility of organic EL display device A | | A | A | B | B | A | B | A | A | A | C to D |
| Blackout | A | C | A | A | B | A | A | C | A | C | B |
| Iridescent color unevenness observed on organic EL display device B | A | A | B | C | C to D | B | C to D | A | A | A | D |
| Color reproducibility of organic EL display device B | A | A | B | C | C to D | B | C to D | A | A | A | D |
| Panel deformation in high humidity | A | A | A | A | A | B | A | B | A | D | A |
| Contrast after storage in high humidity | A | A | A | A | A | B | A | B | A | D | A |

INDUSTRIAL APPLICABILITY

According to the present invention, there can be provided an excellent anti-reflection circular polarizer for preventing the reflection of external light, thereby providing an excellent image display device with very little degradation of anti-reflection functionality caused by decreased levels of polarization under conditions of high humidity while having little deformation of the image display panel.

The invention claimed is:

1. An organic electroluminescence image display device comprising an anti-reflection circular polarizer, wherein the anti-reflection circular polarizer comprises:
   a reflection reduction layer,
   a light-transmissive substrate film,
   a polarizing element, and
   a λ/4 phase-difference layer,
   stacked in this order,
   the light-transmissive substrate film is a polyester film having a moisture permeability of 20 g/m²·day or less and an in-plane retardation of 3000 nm to 30000 nm, and
   a spectrum of light emitted from the organic electroluminescence image display device satisfies the following characteristics of (1)-(6) when the spectrum of the light is resolved into normally distributed peaks having peak tops in color regions of blue, green, and red, $$400 \text{ nm} \leq \lambda B \leq 495 \text{ nm}, \tag{1}$$

$$495 \text{ nm} < \lambda G \leq 580 \text{ nm}, \tag{2}$$

$$580 \text{ nm} < \lambda R \leq 680 \text{ nm}, \tag{3}$$

$$12 \text{ nm} \leq \alpha B \leq 30 \text{ nm}, \tag{4}$$

$$15 \text{ nm} \leq \alpha G \leq 45 \text{ nm, and} \tag{5}$$

$$30 \text{ nm} \leq \alpha R \leq 60 \text{ nm}, \tag{6}$$

wherein λB represents a peak-top wavelength of a blue peak, λG represents a peak-top wavelength of a green peak, λR represents a peak-top wavelength of a red peak, αB represents a standard deviation of the blue peak, αG represents a standard deviation of the green peak, and αR represents a standard deviation of the red peak.

2. The organic electroluminescence image display device according to claim 1, wherein the spectrum of light emitted from the organic electroluminescence image display device satisfies the following characteristics of (7)-(9):

$$0.024 \leq \alpha B/\lambda B \leq 0.065, \tag{7}$$

$$0.033 \leq \alpha G/\lambda G \leq 0.083, \text{ and} \tag{8}$$

$$0.033 \leq \alpha R/\lambda R \leq 0.1. \tag{9}$$

3. The organic electroluminescence image display device according to claim 1, wherein the spectrum of light emitted from the organic electroluminescence image display device satisfies the following characteristics of (10) and (11):
   (10) a ratio of an intensity value at a green peak-top wavelength to an intensity value at a blue peak-top wavelength (G/B peak intensity ratio) is 0.2 to 0.7 and

(11) a ratio of an intensity value at a red peak-top wavelength to an intensity value at a blue peak-top wavelength (R/B peak intensity ratio) is 0.17 to 0.6.

4. The organic electroluminescence image display device according to claim 1, wherein the spectrum of light emitted from the organic electroluminescence image display device satisfies the following characteristics of (12)-(14):

$$187 \text{ nm} \leq \alpha B/\lambda B \times Re \leq 350 \text{ nm}, \tag{12}$$

$$221 \text{ nm} \leq \alpha G/\lambda G \times Re \leq 400 \text{ nm, and} \tag{13}$$

$$353 \text{ nm} \leq \alpha R/\lambda R \times Re \leq 600 \text{ nm}. \tag{14}$$

5. The organic electroluminescence image display device according to claim 1, which is any of (i) a device that emits white light using an organic EL light-emitting element and colors each of red, green, and blue by using color filters, thus emitting each of red, green, and blue, and (ii) a device that comprises an organic EL light-emitting element for a single color and emits other colors by color conversion of the light emitted from an organic EL light-emitting element for a single color by using a phosphor or the like.

6. The organic electroluminescence image display device according to claim 1, wherein a ratio of an in-plane retardation to a retardation in the thickness direction Re/Rth) is 0.200 to 1.2.

* * * * *